United States Patent
Yang et al.

(10) Patent No.: US 10,559,365 B2
(45) Date of Patent: Feb. 11, 2020

(54) PEAK CURRENT SUPPRESSION

(71) Applicant: SanDisk Technologies LLC, Plano, TX (US)

(72) Inventors: Xiang Yang, Santa Clara, CA (US); Huai-yuan Tseng, San Ramon, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 88 days.

(21) Appl. No.: 15/937,420

(22) Filed: Mar. 27, 2018

(65) Prior Publication Data

US 2019/0304549 A1 Oct. 3, 2019

(51) Int. Cl.

| G11C 16/30 | (2006.01) |
|---|---|
| G11C 16/08 | (2006.01) |
| G11C 16/24 | (2006.01) |
| G11C 16/04 | (2006.01) |
| H01L 23/528 | (2006.01) |
| H01L 27/1157 | (2017.01) |
| H01L 27/11524 | (2017.01) |
| H01L 29/08 | (2006.01) |
| H01L 29/10 | (2006.01) |

(52) U.S. Cl.
CPC .......... G11C 16/30 (2013.01); G11C 16/0483 (2013.01); G11C 16/08 (2013.01); G11C 16/24 (2013.01); H01L 23/528 (2013.01); H01L 27/1157 (2013.01); H01L 27/11524 (2013.01); G11C 16/0408 (2013.01); G11C 16/0466 (2013.01); H01L 29/0847 (2013.01); H01L 29/1079 (2013.01); H01L 29/1095 (2013.01)

(58) Field of Classification Search
CPC ..... G11C 16/0483; G11C 16/08; G11C 16/30; G11C 16/3427
See application file for complete search history.

(56) References Cited

U.S. PATENT DOCUMENTS

| 6,956,770 B2 | 10/2005 | Khalid et al. |
|---|---|---|
| 8,804,425 B2 | 8/2014 | Chen et al. |
| 8,854,890 B1 * | 10/2014 | Miwa ................. G11C 16/0483 365/185.02 |
| 8,995,211 B2 | 3/2015 | Lee |
| 9,099,202 B2 | 8/2015 | Mihnea et al. |
| 9,251,902 B2 | 2/2016 | Harada et al. |
| 9,460,805 B1 | 10/2016 | Pang et al. |
| 9,620,238 B2 | 4/2017 | Khandelwal et al. |
| 9,640,273 B1 * | 5/2017 | Chen ................. G11C 16/3427 |

(Continued)

*Primary Examiner* — Tuan T Nguyen
(74) *Attorney, Agent, or Firm* — Vierra Magen Marcus LLP

(57) ABSTRACT

An apparatus includes a plurality of solid-state storage elements, a plurality of control lines coupled to the plurality of solid-state storage elements, and control circuitry in communication with the plurality of control lines. The control circuitry is configured to during a first phase of a control line pre-charging stage, charge one or more unselected control lines of the plurality of control lines using a regulated charging current for a period of time based at least in part on a bias variance state associated with the plurality of control lines, and during a second phase of the control line pre-charging stage, charge the one or more unselected bit lines to an inhibit voltage level using an unregulated charging current.

19 Claims, 14 Drawing Sheets

(56) References Cited

U.S. PATENT DOCUMENTS

| | | | |
|---|---|---|---|
| 10,008,271 B1 * | 6/2018 | Diep | G11C 16/10 |
| 10,283,202 B1 * | 5/2019 | Chen | G11C 16/08 |
| 2005/0057967 A1 | 3/2005 | Khalid et al. | |
| 2006/0002175 A1 * | 1/2006 | Yamamoto | G11C 16/0491 |
| | | | 365/149 |
| 2011/0188317 A1 * | 8/2011 | Mui | G11C 11/5628 |
| | | | 365/185.22 |
| 2013/0279258 A1 | 10/2013 | Lee | |
| 2017/0117035 A1 * | 4/2017 | Mokhlesi | G11C 11/5628 |

* cited by examiner

| BITLINE | $T_1$ | $T_2$ | $T_3$ |
|---|---|---|---|
| N | 0V | 0V | $V_{DD}$ |
| N+1 | 0V | $V_{DD}$ | $V_{DD}$ |
| N+2 | 0V | 0V | $V_{DD}$ |
| N+3 | $V_{DD}$ | $V_{DD}$ | $V_{DD}$ |
| N+4 | 0V | 0V | 0V |
| N+5 | 0V | $V_{DD}$ | $V_{DD}$ |
| N+6 | 0V | $V_{DD}$ | $V_{DD}$ |
| N+7 | 0V | 0V | $V_{DD}$ |
| N+8 | 0V | 0V | $V_{DD}$ |
| N+9 | 0V | $V_{DD}$ | $V_{DD}$ |
| N+10 | 0V | $V_{DD}$ | $V_{DD}$ |
| N+11 | 0V | 0V | $V_{DD}$ |
| N+12 | $V_{DD}$ | $V_{DD}$ | $V_{DD}$ |
| N+13 | 0V | 0V | 0V |
| N+14 | 0V | $V_{DD}$ | $V_{DD}$ |
| N+15 | 0V | 0V | $V_{DD}$ |

FIG. 9

PEAK CURRENT SUPPRESSION

BACKGROUND

Field

This disclosure relates to computing devices. More particularly, the disclosure relates to systems and methods for managing current in solid-state data storage devices.

Description of Related Art

In certain computing systems, such as solid-state data storage systems, high peak current levels can negatively impact performance and/or efficiency.

SUMMARY

In some implementations, the present disclosure relates to an apparatus comprising a plurality of solid-state storage elements, a plurality of control lines coupled to the plurality of solid-state storage elements, and control circuitry in communication with the plurality of control lines. The control circuitry is configured to, during a first phase of a control line pre-charging stage, charge one or more unselected control lines of the plurality of control lines using a regulated charging current for a period of time based at least in part on a bias variance state associated with the plurality of control lines. The control circuitry is further configured to, during a second phase of the control line pre-charging stage, charge the one or more unselected bit lines to an inhibit voltage level using an unregulated charging current.

The control circuitry may be further configured to, during the first phase, charge the one or more unselected control lines to a target voltage level associated with the first phase using the regulated charging current, wherein the target voltage level is based at least in part on the bias variance state. The target voltage level may be, for example, a percentage of the inhibit voltage level based on a variance value associated with the bias variance state. In certain embodiments, the control circuitry is further configured to determine the bias variance state at least in part by calculating a variance value associated with the plurality of control lines. For example, the variance value may be based at least in part on a percentage of the plurality of control lines that are charged to the inhibit voltage level. The control circuitry may be further configured to calculate the variance value at least in part by multiplying the percentage of the plurality of control lines that are charged to the inhibit voltage level by a percentage of the plurality of control lines that are not charged to the inhibit voltage level. In certain embodiments, control circuitry is further configured to calculate the variance value at least in part by determining a first percentage of the plurality of control lines that have a charge state that is different than a neighboring control line on a first side. The control circuitry may be further configured to calculate the variance value at least in part by determining a second percentage of the plurality of control lines that have a charge state that is different than a neighboring control line on a second side opposite the first side, wherein the variance value is based at least in part on a sum of the first percentage and the second percentage. In certain embodiments, the bias variance state is based at least in part on a current loop number of a programming operation.

In some implementations, the present disclosure relates to an apparatus comprising a voltage source input, charge pump circuitry electrically coupled to the voltage source input, the charge pump circuitry configured to provide, from the voltage source input, a controlled current having a first value and a free current having a second value that is higher than the first value, a plurality of data storage cells, a plurality of bit lines each electrically coupled to one or more of the plurality of data storage cells, a plurality of bit line latches configured to store a plurality of bits of data indicating selected and unselected bit lines of the plurality of bit lines, and control circuitry in communication with the plurality of data storage cells. The control circuitry is configured to determine a bit-to-bit relationship associated with the plurality of bits of data, charge the unselected bit lines using the controlled current for a first period of time, a length of the first period of time being based at least in part on the bit-to-bit relationship, and after the first period of time, charge the one or more unselected bit lines using the free current for a second period of time.

The bit-to-bit relationship may indicate a bit-line-to-bit-line charge variation across the plurality of bit lines. In certain embodiments, the control circuitry is further configured to charge the unselected bit lines using the controlled current at least in part by charging the unselected bit lines to a first target voltage, wherein the first target voltage is based at least in part on the bit-to-bit relationship. The control circuitry may be further configured to charge the unselected bit lines using the non-controlled current at least in part by charging the unselected bit lines to a second target voltage, wherein the second target voltage is greater than the first target voltage. For example, the first target voltage can be a percentage of the second target voltage, wherein the percentage is based on the determined bit-to-bit relationship.

In certain embodiments, the control circuitry is further configured to determine the bit-to-bit relationship at least in part by calculating a bit-to-bit variance value associated with the plurality of bit line latches. The bit-to-bit variance value may be based at least in part on a percentage of the plurality of bit lines that are selected. In certain embodiments, the control circuitry is further configured to calculate the bit-to-bit variance value at least in part by multiplying the percentage of the plurality of bit lines that are selected by a percentage of the plurality of bit lines that are unselected. In certain embodiments, the control circuitry is further configured to calculate the bit-to-bit variance value at least in part by determining a first percentage of the plurality of bit lines that have a charge state that is different than a neighboring bit line on a first side, and determining a second percentage of the plurality of bit lines that have a charge state that is different than a neighboring bit line on a second side opposite the first side, wherein; the bit-to-bit variance value is based at least in part on a sum of the first percentage and the second percentage. The bit-to-bit relationship may be based at least in part on a current loop number of a programming operation.

In some implementations, the present disclosure relates to an apparatus comprising a plurality of solid-state storage elements, a plurality of control lines associated with the plurality of solid-state storage elements, means for charging the plurality of control lines to a target voltage, the means for charging comprising a means for limiting a charging current to a managed current and means for limiting a peak current of the solid-state data storage device at least in part by using the means for charging to charge one or more unselected control lines of the plurality of control lines to a first target voltage using the managed current, the first target voltage being based at least in part on a line-to-line charge variation of the plurality of control lines, and using the means for charging to charge one or more unselected control lines of the plurality of control lines to a second target voltage using an unmanaged charging current.

The means for charging may comprises a charge pump. In certain embodiments, the means for limiting the charging current comprises one or more of a transistor, a capacitor, and a current source. The means for limiting the peak current may comprise a solid-state drive controller.

In some implementations, the present disclosure relates to a method of managing current consumption in a solid-state data storage device. The method comprises, for each loop of a programming operation, determining a variance state associated with a plurality of bit lines coupled to a solid-state memory array, charging one or more unselected bit lines of the plurality of bit lines using a controlled charging current for a first period of time based at least in part on the variance state, and after said charging the one or more unselected bit lines using the controlled charging current, charging the one or more unselected bit lines to an inhibit voltage level using a non-controlled charging current.

Charging the one or more unselected bit lines using the controlled charging current may comprise charging the one or more unselected bit lines to a first target voltage based at least in part on the variance state. In certain embodiments, determining the variance state comprises calculating a variance value. For example, the variance value may be based at least in part on a percentage of the plurality of bit lines that are unselected. Calculating the variance value may comprise multiplying the percentage of the plurality of bit lines that are unselected by a percentage of the plurality of bit lines that are selected. In certain embodiments, calculating the variance value comprises determining a first percentage of the plurality of bit lines that have a charge state that is different than a neighboring bit line on a first side. In certain embodiments, calculating the variance value comprises determining a second percentage of the plurality of bit lines that have a charge state that is different than a neighboring bit line on a second side opposite the first side, wherein the variance value is based at least in part on a sum of the first percentage and the second percentage. The variance state may be based at least in part on a current loop number of a programming operation associated with said charging the one or more unselected bit lines using the controlled charging current and said charging the one or more unselected bit lines using the non-controlled charging current.

In some implementations, the present disclosure relates to an apparatus comprising a plurality of solid-state storage elements, a plurality of bit lines associated with the plurality of solid-state storage elements, a plurality of word lines associated with the plurality of solid-state storage elements, and control circuitry in communication with the plurality of bit lines and the plurality of word lines. The control circuitry is configured to, for each of a plurality of loops of a programming operation, apply a program voltage to one or more selected word lines of the plurality of word lines after one or more unselected bit lines of the plurality of bit lines have been charged to an inhibit voltage level. The control circuitry is further configured to verify charge levels of one or more of the solid-state storage elements at least in part by charging one or more unselected word lines of the plurality of word lines using a controlled charging current for a period of time based at least in part on a programming loop number, and after the period of time, charging the one or more unselected word lines to a target voltage using a non-controlled charging current. The period of time that the one or more unselected word lines are charged may be progressively shorter throughout the plurality of loops of the programming operation.

In some implementations, the present disclosure relates to a system comprising a board comprising electrical connections, a memory controller die mounted on the board, and a memory die mounted on the board and electrically coupled to the memory controller via the electrical connections. The memory die comprises a solid-state memory array comprising a plurality of data storage units, and control circuitry coupled to the memory array via a plurality of control lines. The control circuitry is configured to charge a subset of the plurality of control lines using a regulated current for a first period of time, a length of the first period of time being based at least in part on a number of the control lines that are charged to an inhibit charge level, and after the first period of time, charge the subset of the plurality of control lines using an unregulated charging current for a second period of time. In certain embodiments, the period of time comprises a default period of time and a delay period of time, wherein the delay period of time is based on the number of the control lines that are charged to the inhibit charge level.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

FIG. 9 is a diagram showing control line charge levels at different times in accordance with one or more embodiments.

DETAILED DESCRIPTION

Figure 1:
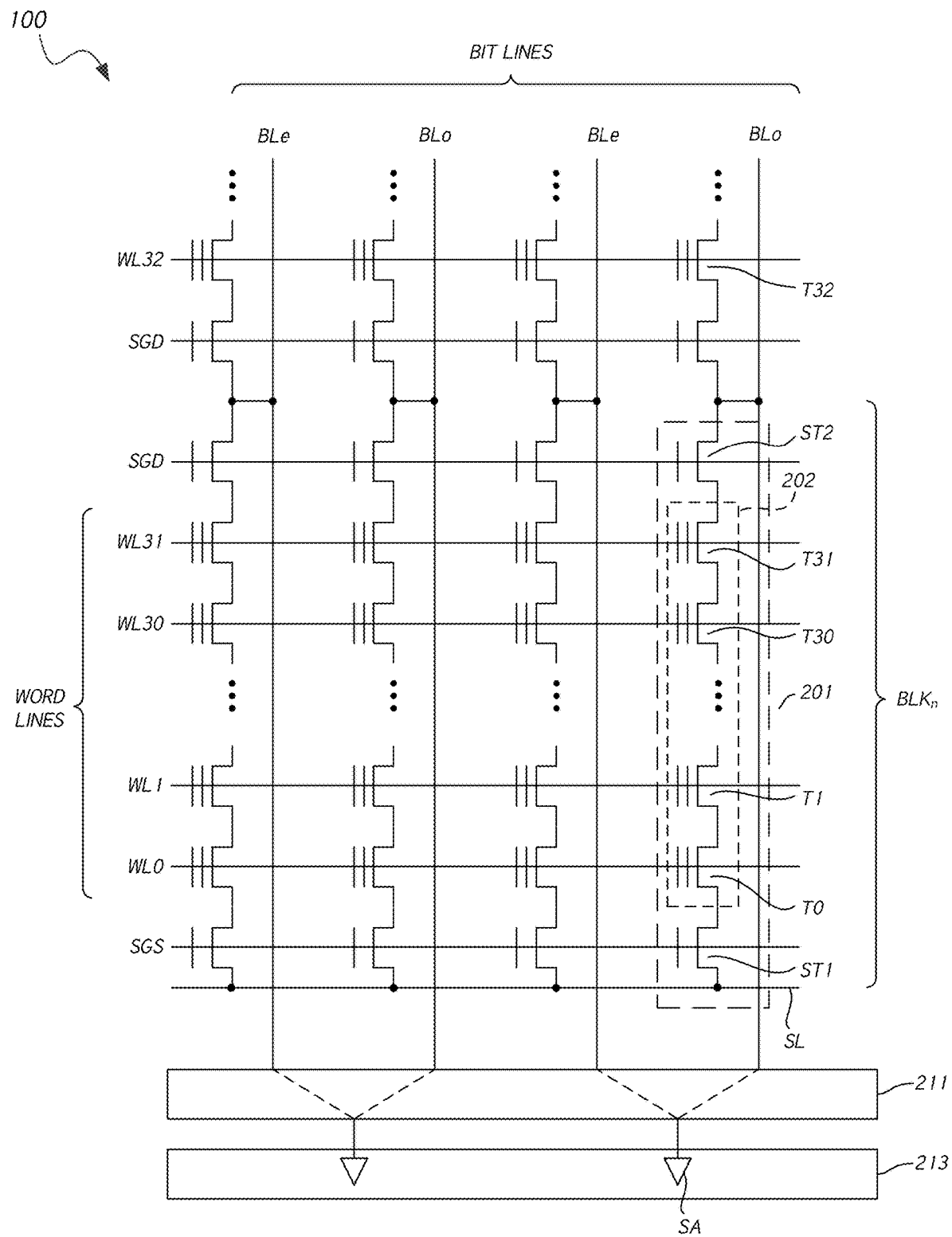
FIG. 1 is a schematic diagram of solid-state memory cells in a data storage device in accordance with one or more embodiments.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

The headings provided herein are for convenience only and do not necessarily affect the scope or meaning of the claims. Disclosed herein are example configurations and embodiments relating to peak current control in computing devices, such as solid-state data storage devices.

Overview

In solid-state data storage devices and systems, power management may have an effect on resource consumption, as well as physical component protection and/or longevity. For example, peak current consumption may represent a significant metric or specification with respect to the operation of the system/device. "Peak current," as used herein, may refer to the highest current level drawn by the solid-state device and/or associated component(s) in connection with a given operation (e.g., program operation, erase operation, read operation, verify operation, etc.) or period. Power management within a device or system may be affected to a substantial degree by peak current levels. For example, in some solid-state memory devices, while peak current consumption may only occur within relatively short periods of time (e.g., current spikes), such peak current consumption may nevertheless require a trade-off in performance during the remainder of the time to ensure that the peak current consumption is sufficiently low. In some implementations, it may be necessary or desirable for program performance to be slowed down by, for example, 5% or more in order to maintain peak current consumption at 40 mA or lower.

In some implementations, peak current consumption may occur in connection with control line pre-charging, wherein control lines, such as bit lines, may be charged-up selectively according to incoming data patterns. For example, during a first phase of the pre-charging process, referred to herein as the "controlled-current phase,", a controlled, current may flow in the relevant control line(s) to charge them to a target voltage level. The terms "controlled current" and "controlled charging current" are used herein according to their broad and ordinary meanings, and generally refer to current flow that is restricted, managed, suppressed, and/or adjusted in some manner. During a second phase of the pre-charging process, referred to herein as the "free-," or "uncontrolled"/"non-controlled" current phase, unlimited current may be allowed to relatively rapidly charge up the desired control line(s) (e.g., bit line(s)). That is, during the second phase, there may be little or no compliance control of the charging current. The terms "non-controlled" and "uncontrolled" charging current are used herein according to their broad and ordinary meanings, and generally refer to charging current, such as for charging a control line, that is not substantially restricted or suppressed.

As described in detail herein, with respect to a programming operation implemented over a number of programming pulses, different current spikes may be experienced in connection with different programming pulses. Therefore, by controlling peak current with respect to specific programming pulses, peak current control may be achieved with relatively little performance impact. The present disclosure provides systems, devices, and methods for providing dynamic peak current control for solid-state data storage, wherein peak current is reduced and/or controlled based at least in part on the relevant program loop number, incoming data pattern, and/or control line charge state variance, or other parameter(s). In some implementations, dynamic peak current reduction in accordance with the present disclosure may provide reduced peak current by as much as 20% or more, without substantial performance penalty. Furthermore, embodiments of the present disclosure may provide program performance improvements by as much as 5% or more without changing peak current consumption.

As used in this application, "non-volatile solid-state memory," "non-volatile memory," "NVM," "solid-state memory," "solid-state data storage," or variations thereof may refer to solid-state memory such as NAND flash. However, the systems and methods of this disclosure may also be useful in more conventional hard drives and hybrid drives including both solid-state and hard drive components. In some embodiments, the solid-state memory may be used in a computing device to extend storage capacity of volatile memory such as DRAM. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), Magnetoresistive RAM (MRAM), or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

Solid-State Data Storage

FIG. 1 is a schematic diagram of solid-state memory cells in a non-volatile memory device according to an embodiment. The memory cells of FIG. 1 may be arranged according to a NAND flash memory structure. A solid-state memory array, such as a NAND flash array, may include memory cell units 201, referred to herein as "NAND strings," or "memory strings," each unit comprising a memory cell group 202 that includes a plurality of serially-connected solid-state storage elements. "Solid-state storage elements," or "data storage cells," may comprise memory cell transistors T. The terms "solid-state storage element" and "data storage cell" are used herein according to their broad and ordinary meaning, and may refer to any device, transistor, cell, unit, or plurality or combination of the same, configured to exhibit a particular electrical or magnetic or electromagnetic characteristic, which characteristic represents a value representative of data, as described herein. In certain embodiments the characteristic may comprise a level of electrical charge, a level of electrical resistance, a magnetic orientation, or the like. The memory array 100 of FIG. 1 includes various control lines, including word lines, which are represented by the identified gate contact lines WL0-WL31, and bit lines, which are represented by the lines BLe, BLo. The term "control line" is used here according to its broad and ordinary meaning, and may refer to conductive paths or nodes that may be used to affect or alter the charge state(s) and/or current flow of one or more solid-state storage elements. For example, control lines may be conductively coupled to one or more terminals of a solid-state storage element, such as a floating transistor gate, a charge trap transistor gate, a source, a drain, or another terminal/node. The control lines may comprise metallic, or polysilicon (or a combination of both) stripes configured to receive and transmit voltage signals to the various nodes of the memory cells. The memory string 201 may include a first select transistor ST1 that is connected between one end of the memory cell group 202 and a source line SL, as well as a second select transistor ST2 that is connected between the other end of the memory cell group 202 and a bit line BL (shown as BLo in FIG. 1).

As referenced above, between adjacent memory cell units, a plurality (e.g., 32) of word lines WL may connect gate electrodes of the memory cells on the same row. The array may further include a first select gate line SGS configured to connect gate electrodes of the first select transistor ST1 and a second select gate line SGD configured to connect gate electrodes of the second select transistor ST2. While only four columns of memory strings are illustrated, it should be understood that the memory array of FIG. 1 may include any number of columns, wherein each word line is connected to a control gate of a transistor cell of each column. For example, the memory array may include thousands of storage elements on a word line in some embodiments.

Groups of memory cell units associated with separate bit lines may be organized into blocks of memory, such as block $BLK_n$. The memory cell array may further include additional blocks like the block $BLK_n$ having the same general structure as block $BLK_n$. In certain embodiments, data erase operations are performed in units of a block BLK, and data program and read operations are performed in units of a page. Within the block $BLK_n$, each memory cell group 202 may include, for example, 32 memory cells (e.g., T0-T31).

In certain embodiments, alternating cells on a word line may correspond to even and odd pages, respectively. The even and odd pages may be programmable independently from one another. Information may be read from a memory cell or unit by a sense amplifier (SA) circuit 213. For example, each bit line may be connected to a sense amplifier, and the sense amplifier may advantageously have sufficient size to enable reading and writing information into the memory cells correctly. The sense amplifier circuit 213 may be configured to be selectively connected via a selector circuit 211 to an even bit line BLe (e.g., a set of even-numbered bit lines BL), or to an odd bit line BLo (e.g., a set of odd-numbered bit lines BL), and to detect the potential of the even bit line(s) BLe or the odd bit line(s) BLo to store the detected potential in a data cache. The selector circuit 211 may select between the even and odd bit line BL groups and connect the selected group to the sense amplifiers SA. Although FIG. 1 identifies even and odd bit lines, the principles disclosed herein are applicable to programming schemes using all bit line programming, wherein bit lines are not selected in even/odd groupings.

During data programming, bit lines selected for programming may be provided biasing charge levels associated with programming, whereas bit lines not selected for programming may be provided a biasing charge level that is calibrated to inhibit programming of memory cells associated with bit lines not selected for programming when a programming voltage is applied to control gates thereof. The terms "selected" and "unselected" are used herein to refer to different control line biasing levels or states, and may be used interchangeably in some contexts. For example, in some contexts, "selected" may refer to a subset of a plurality of control lines (e.g., such as one bit line) that is selected for programming, wherein "unselected" refers to a subset of a plurality of control lines (e.g., all even bit lines) for which the associated memory cells are not being programmed, but are coupled to the sense amplifier circuitry 213 for charging to an inhibit voltage during a pre-charging stage.

The select gates ST1, ST2 are controlled by applying appropriate voltages to respective control gates thereof. Generally, each of the transistors T0-T31 comprises a control gate and a floating gate. The floating gates of the transistors T0-T31 allow for the transistor cells to serve as charge storage elements. In some embodiments, the individual depicted storage elements may include multiple transistors, or may be different than that depicted in FIG. 1. While thirty-two storage elements are illustrated in FIG. 1, memory strings in accordance with the present disclosure can have sixty-four, or more or fewer storage elements, for instance.

When programming a memory cell of the memory array 100, a program voltage may be applied to the control gate of the storage element. When the program voltage is applied to the selected memory cell, the associated bit line may generally be grounded. Electrons from the channel of the floating-gate transistor may be injected into the floating gate in response to application of the program voltage. When electrons accumulate in the floating gate, the floating gate becomes negatively charged and the charge level (referred to herein as the voltage threshold $V_{TH}$) of the storage element is raised. To apply the program voltage to the control gate of the storage element being programmed, that program voltage is applied on the appropriate word line. As discussed above, in some configurations, one storage element in each of the memory strings share the same word line. For example, when programming storage element T0 of the memory array 100, the program voltage may also be applied to the control gates of the other storage elements tied to the word line WL0.

The illustrated bank of memory strings may be part of a two-dimensional (2D) memory array, or a three-dimensional (3D) array. In contrast to 2D memory arrays, which are generally formed along a planar surface of a semiconductor wafer, 3D arrays can generally extend up from the wafer surface and generally include stacks, or columns, of memory cells extending upwards (i.e., orthogonal to the wafer surface). Various 3D arrangements/architectures are possible, and examples of such 3D architectures and their formation are described in U.S. Pub. 2012/0220088 and in U.S. Pub. 2013/0107628, which are hereby incorporated by reference in their entirety. Descriptions of the pre-charging of control lines, and suppression of peak current in connection therewith, provided herein are applicable with respect to control lines (e.g., bit lines or word lines) associated with 2D, 3D, or any other type of solid-state memory architecture.

Figure 2:
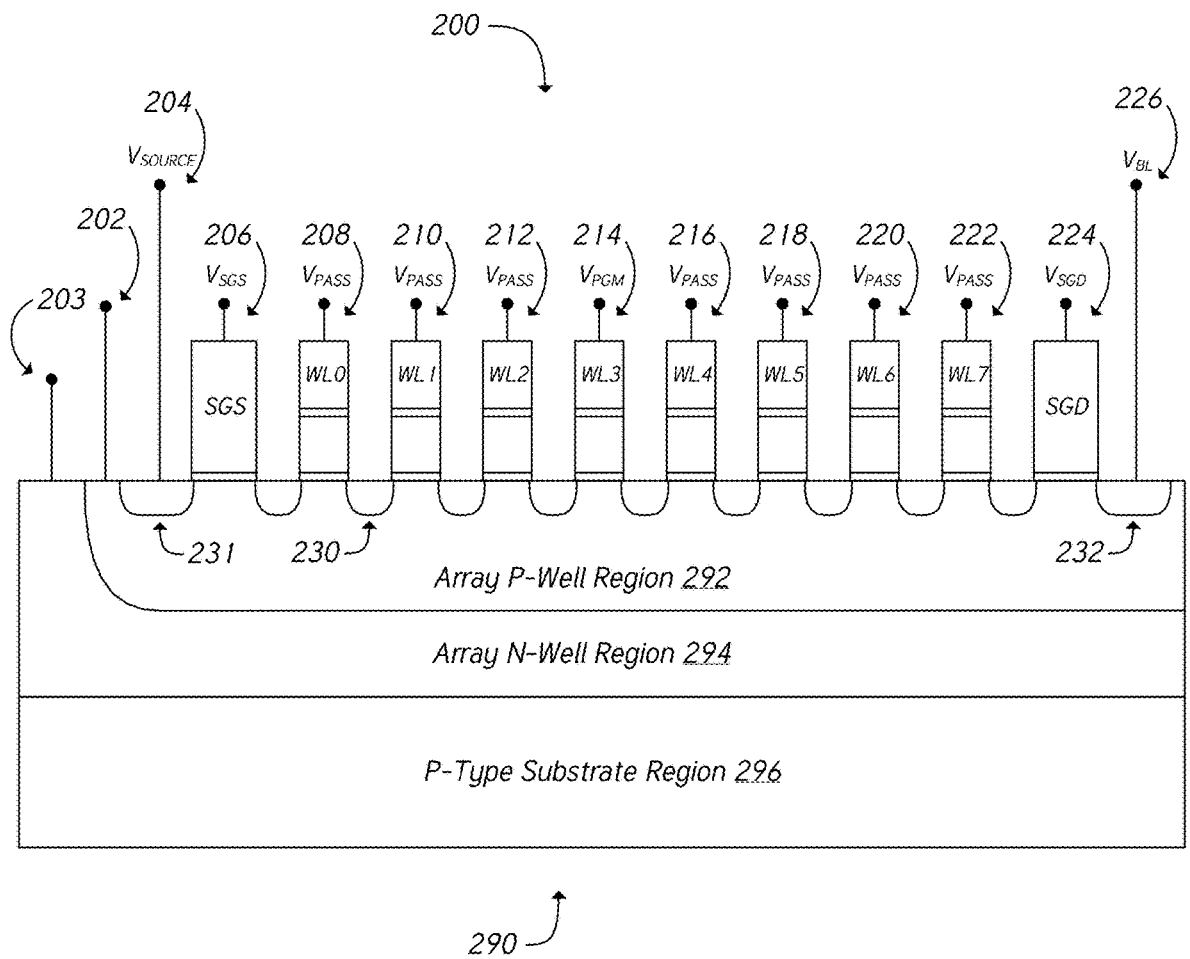
FIG. 2 depicts a cross-sectional view of a memory string formed on a substrate in accordance with one or more embodiments.

FIG. 2 depicts a cross-sectional view of a memory string 200 formed on a substrate in accordance with one or more embodiments. The view of FIG. 2 is simplified and not to scale. For simplicity, FIG. 2 illustrates an example 2D NAND string. However, it should be understood that the principles disclosed herein are applicable to other solid-state memory architectures, including 3D memory devices and architectures (e.g., 3D NAND). For floating gate transistors, such as may be utilized in NAND flash memory or other solid-state data storage devices, the threshold voltage characteristic of the transistor cell may generally be controlled by the amount of charge that is retained on the floating gate of the transistor cell. That is, for a given level of charge on the floating gate, there is a corresponding voltage (threshold) that must be applied to the associated control gate before the transistor is turned "on" to permit conduction between its source and drain regions. The floating gate can hold a range of charges, and therefore can be programmed to various threshold voltage levels within a threshold voltage window.

The illustrated memory string 200 includes a source-side select gate (or SGS transistor) 206, a drain-side select gate (or SGD transistor) 224, and eight storage elements 208, 210, 212, 214, 216, 218, 220 and 222, formed on a substrate 290. A number of source/drain regions, one example of which is source drain/region 230, are provided on either side of each storage element. In one embodiment, the substrate 290 employs a triple-well technology, which includes an array p-well region 292 within an array n-well region 294, which in turn is within a p-type substrate region 296. The memory string and its non-volatile storage elements can be formed, at least in part, on the array p-well region 292. Although certain n-type and p-type regions are shown and described, it should be understood that such regions may be either of n- or p-type in certain embodiments.

A voltage $V_{SOURCE}$ may be provided to a source line contact 204. The source line contact may have an electrical connection to the diffusion region 231 of SGS transistor 206. A bit line voltage $V_{BL}$ is supplied to bit line contact 226, which is in electrical contact with the diffusion region 232 of the SGD transistor 224. Voltages, such as body bias voltages, can also be applied to the array p-well region 292 via a terminal 202 and/or to the array n-well region 294 via a terminal 203.

During a program operation, a control gate voltage $V_{PGM}$ may be provided on a selected word line, such as word line WL3, which is associated with storage element 214. In certain embodiments, the control gate of a storage element may be provided as a portion of the word line. For example, WL0, WL1, WL2, WL3, WL4, WL5, WL6 and WL7 can extend via the control gates of storage elements 208, 210, 212, 214, 216, 218, 220 and 222, respectively. A pass voltage $V_{PASS}$ may be applied to the remaining word lines associated with memory (e.g., NAND) string 200, in one possible boosting scheme. $V_{SGS}$ and $V_{SGD}$ are applied to the select gates 206 and 224, respectively.

Figure 3:
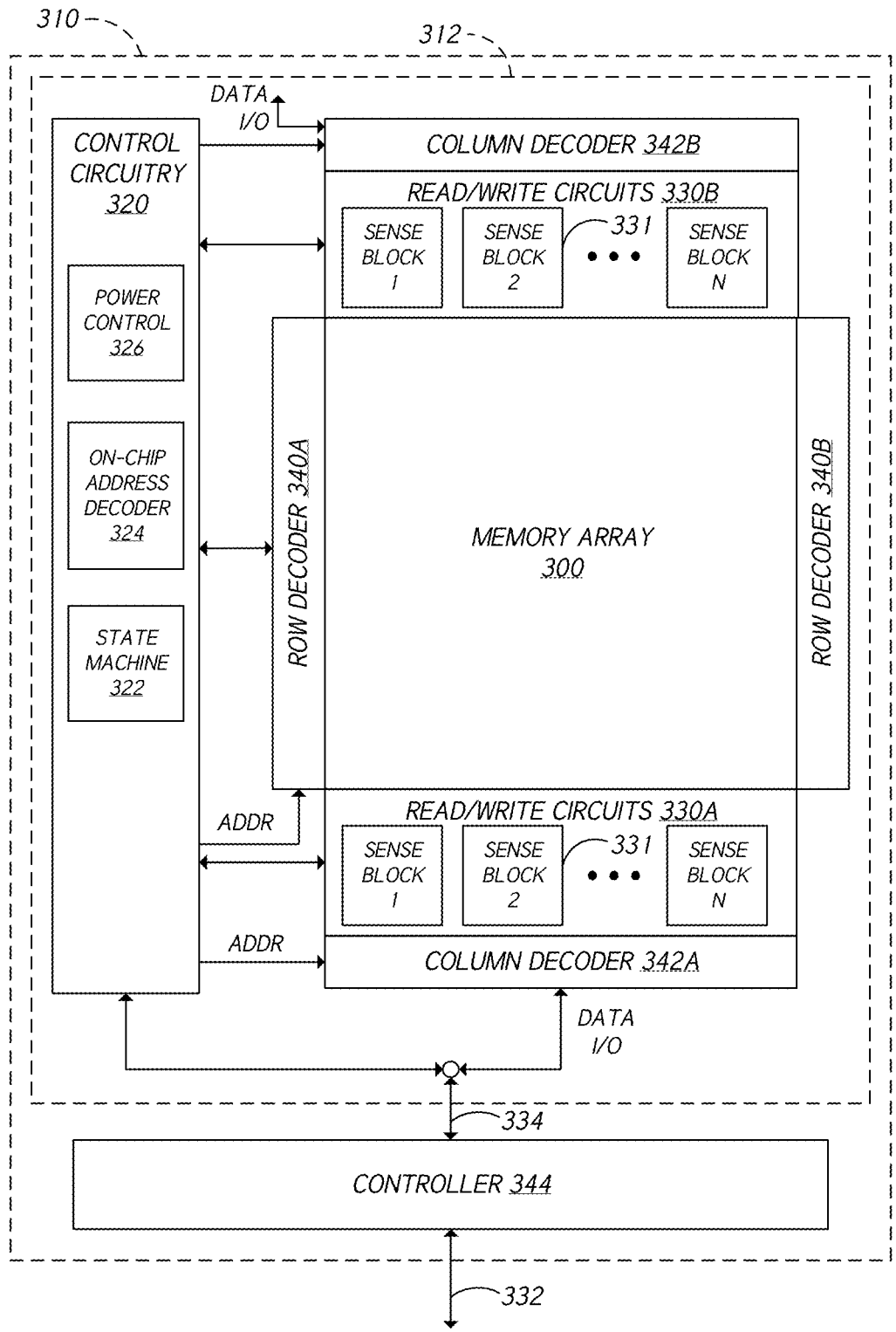
FIG. 3 is a block diagram of a non-volatile storage device in accordance with one or more embodiments.

FIG. 3 illustrates a non-volatile storage device 310 that may include one or more memory die or chips 312. Such die/chip(s) 312 and/or controller 344 or other control circuitry, may be mounted or otherwise connected to one or more controller boards, such as printed circuit boards (PCBs) having certain circuit chips and/or discrete components mounted or otherwise connected thereto, for providing control functionality for the system. The term "board" is used herein according to its broad and ordinary meaning, and may refer to any type of board or substrate on which one or more chips or devices may be mounted. The memory die 312 includes an array (two-dimensional or three dimensional) of solid-state memory cells 300, control circuitry 320, and read/write circuits 330A, 330B. The memory cells 300 may have a 3D memory (e.g., 3D NAND) configuration, or a 2D memory configuration.

In one embodiment, access to the solid-state memory array 300 by the various peripheral circuits associated with the memory array 300 is implemented in an at least partially symmetrical fashion, on opposite sides of the array 300, which may allow for the densities of access lines and/or circuitry on each side of the memory array to be reduced (e.g., by half). The read/write circuits 330A and 330B may include one or more sense blocks 331, which allow a page of memory cells of the solid-state memory array 300 to be read and/or programmed in parallel. The solid-state memory array 300 may be addressable by word lines via row decoders 340A, 340B, and by bit lines via column decoders 342A, 342B. In some embodiments, a controller 344 is included in the same memory device 310 (e.g., a removable storage card or package) as the one or more memory die 312. Commands and/or data may be transferred between the host and controller 244 via lines 332, and between the controller 344 and the one or more memory die 312 via lines 334. Some implementations can include multiple chips 312. The memory controller die 344 may be any type of memory controller or control circuitry communicatively and/or electrically coupled to the die 312.

In certain embodiments, the control circuitry 320 and/or other control circuitry of the non-volatile storage device may comprise hardware, firmware, or a combination of hardware and software or firmware. For example, control circuitry 320 may include an application specific integrated circuit (ASIC), a field programmable gate array (FPGA), a circuit, a digital logic circuit, an analog circuit, a combination of discrete circuits, gates, or any other type of hardware or combination thereof. In addition, or alternatively, control circuitry 320 may comprise instructions executable with a processor or processor circuitry to implement one or more of the features of the control circuitry 320. The control circuitry 320 (which may be a flash memory controller in certain embodiments) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller.

The control circuitry 320 is a component, or module, designed, and built, to measure and/or control the time required for a control line to change voltage bias levels from an initial bias level to a target voltage bias level. In certain embodiments, control circuitry of the non-volatile storage device 310 may comprise hardware, firmware, or a combination of hardware and software or firmware. For example, control circuitry may include an application specific integrated circuit (ASIC), a field programmable gate array (FPGA), a circuit, a digital logic circuit, an analog circuit, a combination of discrete circuits, gates, or any other type of hardware or combination thereof. In addition, or alternatively, control circuitry may include memory hardware that comprises instructions executable with one or more processors or processor circuitry to implement one or more of the features of the control circuitry. The control circuitry (which may comprise or be a component of a flash memory controller in certain embodiments) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller.

The control circuitry 320 may cooperate with the read/write circuits 330A, 330B to perform memory operations on the memory array 300. The control circuitry 320 can include one or more of a state machine 322, an on-chip address decoder 324 and a power control module 326. The state machine 322 may provide chip-level control of memory operations. The on-chip address decoder 324 may provide an address interface to convert between the address that is used by the host or a memory controller to the hardware address used by the decoders 340A, 340B, 342A, 342B. The power control module 326 may control the power and/or voltages supplied to the word lines and bit lines during memory operations. In one embodiment, power control module 326 includes one or more charge pumps that can create voltages larger than the supply voltage.

The term "control circuitry" is used herein according to its broad and ordinary meaning, and may refer to any circuitry, module, device or component of the non-volatile storage device 310 configured to perform any of the functional aspects of the present disclosure. For example, one or any combination of the control circuitry 320, the power control circuit 326, the decoder circuit 324, the state machine circuit 322, the decoder circuit 342A, the decoder circuit 342B, the decoder circuit 340A, the decoder circuit 340B, the read/write circuits 230A, the read/write circuits 230B, and/or the controller 344 can be referred to as "control circuitry." The control circuitry of the non-volatile storage device 310 may provide a means for limiting a peak current of the non-volatile storage device in accordance with aspects of the present disclosure.

Figure 4:
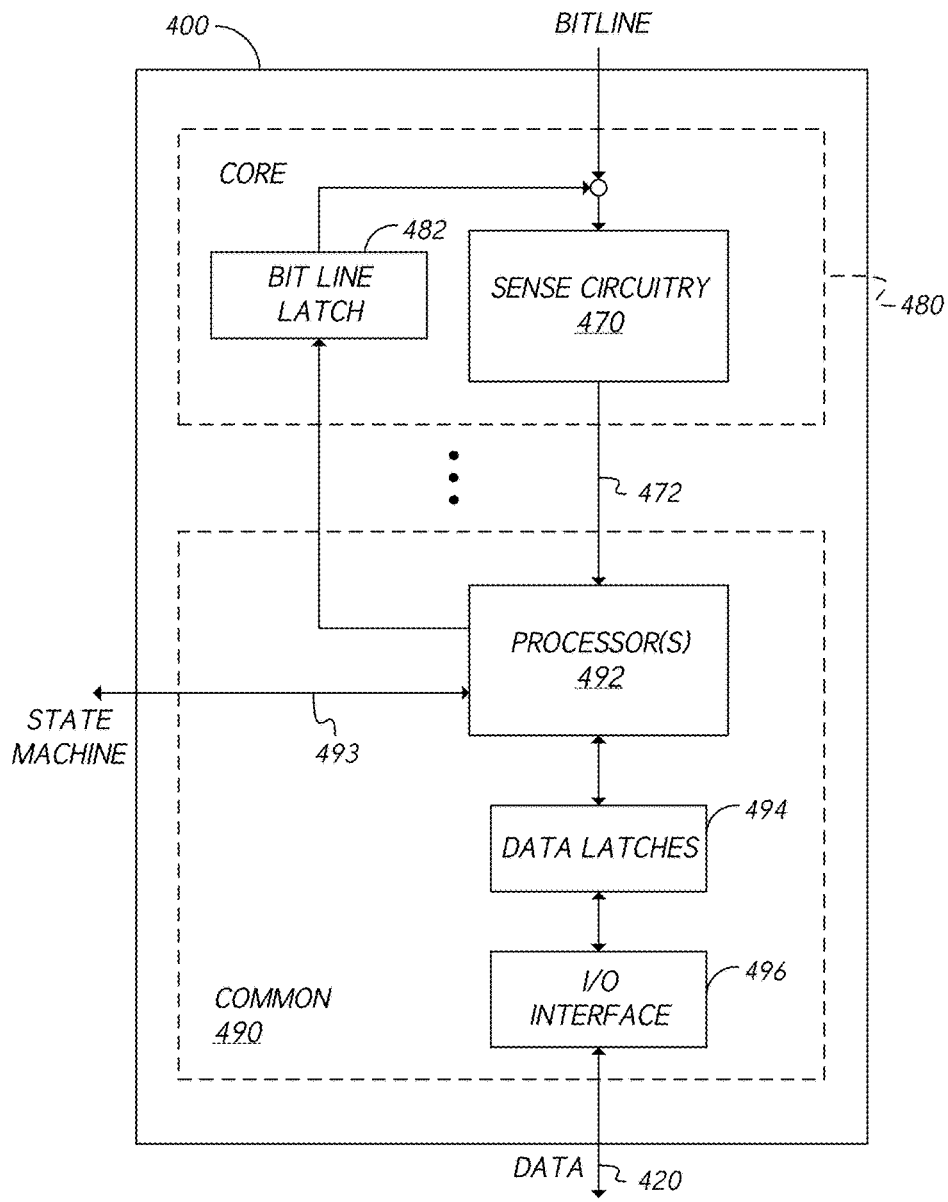
FIG. 4 is a block diagram of sense circuitry in accordance with one or more embodiments.

FIG. 4 is a block diagram of an individual sense block 400 partitioned into a core portion, referred to as a sense module 480, and a common portion 490. In some embodiments, a separate sense module 480 may be provided for each bit line, whereas a single common portion may be provided for a set of multiple sense modules. In certain embodiments, a sense block includes one common portion 490 and eight or more sense modules 480. Each of the sense modules 480 in a group may communicate with the associated common portion via a data bus 472. For further details, refer to U.S. Patent Application Publication 2006/0140007, which is incorporated herein by reference in its entirety.

The sense module 480 may comprise sense circuitry 470. In certain embodiments, the sense circuitry 470 is configured to determine whether a conduction current in a connected bit line is above or below a predetermined threshold level. Alternatively or additionally, the sense circuitry 470 may be configured to determine whether current flows in a bit line and/or memory cell when a given threshold voltage is applied to an associated word line. In some embodiments, the sense module 480 includes a sense amplifier circuit. The sense module 480 may further include one or more bit line latches that are used to set a voltage condition on the connected bit line(s). For example, a predetermined state latched in bit line latch 482 may result in the connected bit line(s) being pulled to a program inhibit state (e.g., $V_{DD}$). The inhibit voltage level ($V_{DD}$) is provided by a voltage source input, which may be any type of voltage (or current) source. Although referred to herein as "bit line latches," in some contexts, it should be understood that such elements may be any type of sense data latches ("SDLs") that store control line biasing settings/information in accordance with embodiments of the present disclosure.

The common portion 490 of the sense block 400 comprises one or more processors 492, a set of data latches 494 and/or an input/output (I/O) interface 596 coupled between the set of data latches 494 and a data bus 420. The processor(s) 492 may be configured to perform various computations. For example, the processor(s) 492 may be configured to determine the data stored in the sensed memory cell, and store the determined data in the set of data latches 494. The set of data latches 494 may be used to store data bits determined by processor(s) 492 during a read operation. The data latches 494 may also be used to store data bits imported from the data bus 420 during a program operation. The imported data bits represent write data meant to be programmed into the memory. The I/O interface 496 provides an interface between data latches 494 and the data bus 420.

During read or sensing, the operation of the sense block 400 may be under the control of the state machine that controls the supply of different control gate voltages to the addressed cell. As the state machine steps through the various predefined control gate voltages corresponding to the various memory states supported by the memory, the sense module 480 may trip at one of these voltages and an output will be provided from sense module 480 to the processor(s) 492 via the bus 472. At that point, the processor(s) 492 may determine the resultant memory state by consideration of the tripping event(s) of the sense module and the information about the applied control gate voltage from the state machine via the input lines 493. It then computes a binary encoding for the memory state and stores the resultant data bits in the data latches 494. In some embodiments, the bit line latch 482 serves as a latch for latching the output of the sense module 480, and as a bit line latch as described above. The bit line latch 482 may be one of a plurality of bit line latches configured to store a plurality of bits of data indicating selected and unselected bit lines of a plurality of bit lines or other control lines.

During program or verify, the data to be programmed may be stored in the set of data latches 494 from the data bus 420. The program operation may be performed at least partially under the control of the state machine, and may comprise a series of programming voltage pulses (with increasing magnitudes) applied to the control gates of the addressed memory cells. When the bit line is not associated with a memory cell being programmed, prior to a programming pulse of a programming operation, the bit line may be charged to an inhibit voltage as part of a pre-charging stage, which is described in detail below, when a memory transistor such as M1 is placed in a program inhibit mode, the channel voltage is boosted to a high voltage.

Each programming pulse may be followed by a verify process to determine if the memory cell has been programmed to the desired state. The processor(s) 492 may monitor the verified memory state relative to the desired memory state. When the two are in agreement, the processor(s) 492 may set the bit line latch(es) 482 to cause the bit line(s) to be pulled to the program inhibit voltage level, as referenced above. This inhibits the cell coupled to the bit line from further programming even if it is subjected to programming pulses on its control gate. In some embodiments, the processor(s) 492 initially load the bit line latch 482 and the sense circuitry sets it to an inhibit value during the verify process. In one embodiment, the magnitude of the inhibit value depends on the location of the selected word line.

The data latch stack 494 may contain a stack of data latches corresponding to the sense module 480. In some embodiments, there are 3-5 (or another number) data latches per sense module. In some embodiments, the latches are each one bit. The data latches may be implemented as a shift register so that the parallel data stored therein is converted to serial data for the data bus 420, and vice versa. In one embodiment, all the data latches corresponding to the read/write block of M memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 5:
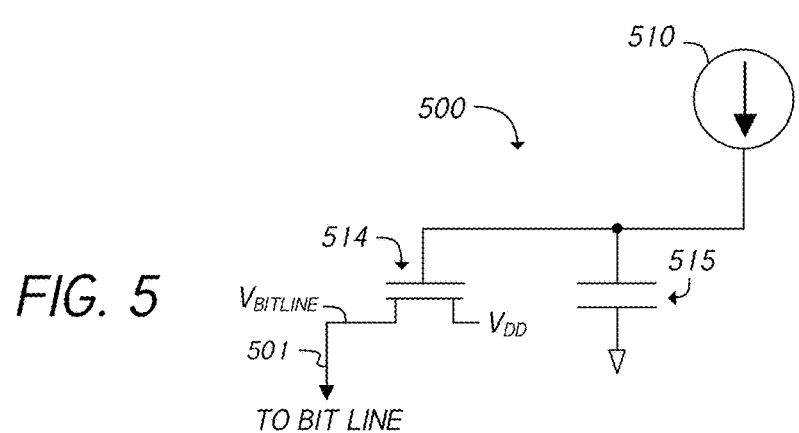
FIG. 5 is a schematic diagram of charge pump circuitry in accordance with one or more embodiments.

FIG. 5 is a schematic diagram of charge pump circuitry 500 according to one or more embodiments. The circuitry 500 may be used in a sense amplifier. In certain embodiments, the circuit 500 may be used in connection with the sense circuitry 470 shown in FIG. 4 and described above. The circuit 500 may include a bit line clamp transistor 514 that is coupled to the bit line. Although a single transistor 514 is shown and described, it should be understood that the illustrated transistor 514 may represent a series-connected transistor stack in some embodiments. One terminal of the transistor 514 is connected to the supply voltage (also referred to herein as "$V_{DD}$," and may also represent an inhibit voltage in certain configurations). $V_{DD}$ may be an externally- or internally-supplied voltage. In certain embodiments, the rate at which the transistor 54 provides the voltage $V_{DD}$ to the bit line depends on its gate voltage.

The circuit 500 may include one or more capacitors 515. For example, the capacitor(s) 515 may have one node coupled to the gate of the transistor 514 and the other node coupled to a ground reference. The circuit 500 may also comprise or be connected to a current supply 510, which may be variable in some embodiments. The current supply 510 may be coupled to the node of the capacitor(s) 515 that is coupled to the gate of the bit line clamp transistor 514. Therefore, the voltage provided to the gate of the transistor 514 may be controlled at least in part by charging capacitor(s) 515 using the current source 510.

The charge pump circuitry 500 may serve to facilitate or guarantee a constant current value provided to the associated bit line(s) on the path 501. For example, during a controlled-, or constant-current phase of a pre-charging stage for pre-charging the bit line to a target voltage, the charge pump circuitry may be used to provide a constant current to prevent unwanted current spikes when the bit line voltage ramps-up too quickly during the constant-current phase. In order to control the bit line voltage ramp-up rate, the gate bias on the transistor(s) 514 may be modulated by the current source 510. With a higher current from the current source 510, the gate of the transistor 514 bias ramps up faster, resulting in a faster ramp up of the bit line voltage. On the other hand, with a smaller current from the current source 510, the gate of transistor 514 bias ramps up more slowly, resulting in a slower ramp up of the bit line voltage. In some embodiments, a slower bit line charging rate can be achieved by reducing the current from the current source 510 to about ¾ of the full magnitude of the current source. Any percentage of the full magnitude may be used for the slower charge rate. Also, there may be any number of different charge rates.

Although the charge pump circuitry 500 is described herein in certain contexts as providing a charging current for a bit line control line, it should be understood that the charge from circuitry 500 and/or other charge pumps or charged from circuitry described herein may be used for word line charging, or other control line charging. The term "charge pump circuitry" may generally refer to any type or configuration of circuitry and/or devices configured to provide control line charging/pre-charging in accordance with aspects of the present disclosure. The charge pump circuitry 500 may provide a means for charging a plurality of control lines to a target voltage and/or means for limiting a charging current from a voltage source to a managed current.

In a solid-state data storage system, different charge pumps may be utilized for word line and bit line charging, respectively. For example, the voltage source input (e.g., battery) used for various control line charging functionality may vary for bit line and word line. Furthermore, loading of such circuits may vary for a bit line and word line applications. For example, for certain word line charging applications, a charge pump may advantageously support 0 to 10 V, but may provide relatively lesser accuracy (e.g., 0.1 V step size accuracy, or the like), compared to a bit line charge pump. That is, relative to bit line charge pumps, a word line charge pump may represent a relatively strong pump with lesser accuracy. For bit line charge pumps, different pumps may be used for different stages of charging. For example, for pre-charging, the relevant target voltage may be around, for example, 3 V, whereas for read/verify stage charging, the voltage target may be less, such as around 0.5 V, which may not require as strong a pump, but may require greater accuracy (e.g., 0.01 V accuracy).

Solid-State Programming

Figure 6:
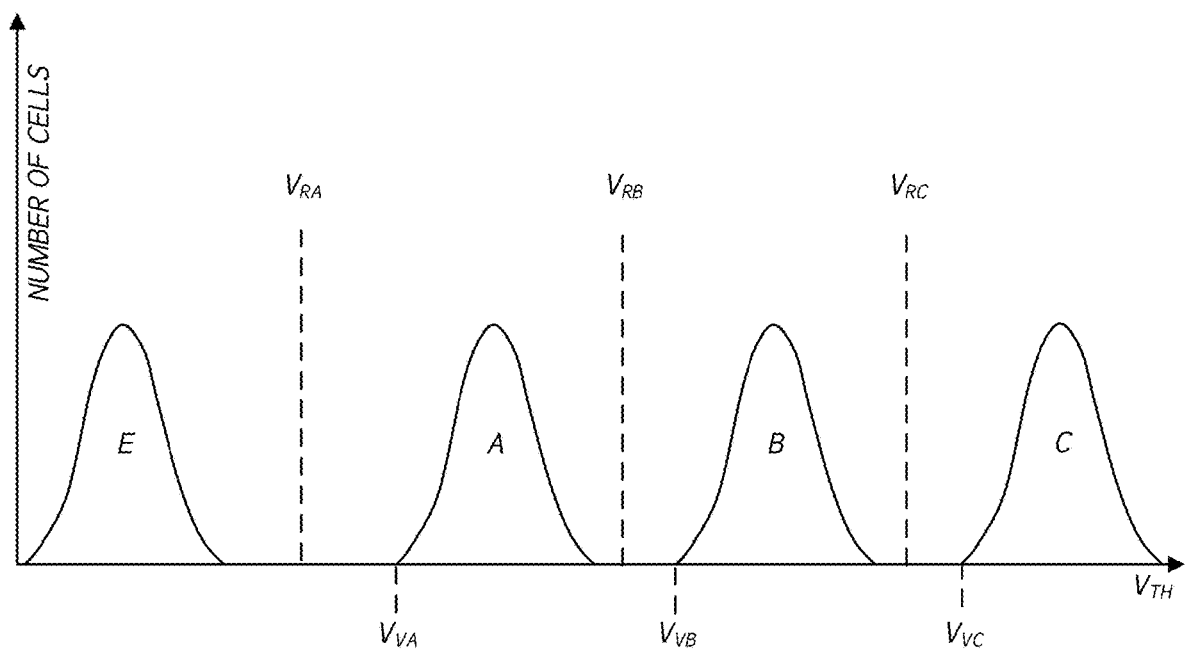
FIG. 6 is a graph showing a probability distribution of cells in a solid-state memory in accordance with one or more embodiments.

FIG. 6 is a graph showing a probability distribution of cells in a solid-state memory device according to an embodiment. The distribution of FIG. 6 corresponds to a four-state programming scheme, in which each storage element stores two bits of data identifiable by the charge level $V_{TH}$ (also referred to as a threshold voltage) associated with the cell. The charge level $V_{TH}$ is the voltage level that causes the memory cell to conduct current when that voltage level is applied to the gate of the memory cell via the word line. In a four-state programming scheme, there are generally four $V_{TH}$ ranges, each range assigned to one of the data values "11," "10," "01," and "00." In some embodiments, the $V_{TH}$ of a cell after an erase operation (the 'E' state in FIG. 6) is negative and defined as "11," whereas positive $V_{TH}$ values may be used for the states of "10," "01," and "00." The specific relationship between the data programmed into the storage element and the threshold voltage ranges of the element depends upon the data encoding scheme adopted for the storage elements. For example, U.S. Pat. Nos. 6,222,762 and 7,237,074, both of which are incorporated herein by reference in their entirety, describe various data encoding schemes for multi-state flash storage elements.

For illustration purposes, a first threshold voltage distribution 'E' is provided for erased (erased-state) storage elements. Three additional threshold voltage distributions are illustrated as programmed states 'A', 'B' and 'C,' respectively. In one embodiment, the threshold voltages in the Erased-state are negative, and the threshold voltages in the A, B and C states are positive. Read reference voltages, $V_{RA}$, $V_{RB}$ and $V_{RC}$, are also provided for reading data from storage elements. By testing whether the threshold voltage of a given storage element is above or below $V_{RA}$, $V_{RB}$ and $V_{RC}$, the system can determine the state that the storage element is in. Further, verify reference voltages, $V_{VA}$, $V_{VB}$ and $V_{VC}$ are provided. When programming storage elements to the A state, B state or C state, the system will test whether those storage elements have a threshold voltage greater than or equal to $V_{VA}$, $V_{VB}$ and $V_{VC}$, respectively.

Figure 7:
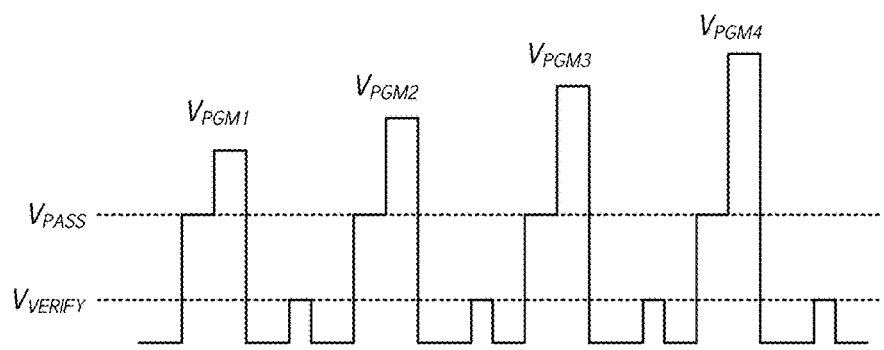
FIG. 7 depicts a series of program and verify pulses according to one or more embodiments.

In full-sequence programming, storage elements can be programmed from the erased state directly to any of the programmed states A, B or C. For example, a population of storage elements to be programmed may first be erased so that all storage elements in the population are in the erased state. A series of program pulses such as depicted in FIG. 7 may be used to program storage elements directly into the A, B and C states. While some storage elements are being programmed from the erased state to the A state, other storage elements are being programmed from the erased state to the B state and/or from the erased state to the C state. In certain embodiments, unlike in full-sequence programming, memory cells are first programmed to an intermediate state prior to completion of programming. For example, memory cells targeted for the B and C states may be programmed to an intermediate state in a first programming pass. Then, in a second programming pass, memory cells targeted for the C state are programmed from the intermediate state to the C state and memory cells targeted for the A state are programmed form the erased state to the A state. One or both of the first and second programming passes may have multiple program loops. When the threshold voltage of a storage element reaches its respective verify voltage/charge level, the storage element may be locked out from further programming.

FIG. 7 depicts a series of program and verify pulses which may be applied to a selected word line during a programming operation. A programming operation may include multiple programming iterations, wherein each iteration applies one or more program pulses (voltages) followed by one or more verify voltages, to a selected word line. In one possible approach, the program voltages are stepped up in successive iterations. Moreover, the program voltages may include a first portion which has a pass voltage ($V_{PASS}$) level, e.g., 6-8 V, followed by a second portion at a program level ($V_{PGM}$), e.g., 12-25 V. For example, first, second, third and fourth program pulses, as shown in FIG. 7, may have program voltages of $V_{PGM1}$, $V_{PGM2}$, $V_{PGM3}$, and $V_{PGM4}$, respectively, and so forth. A set of one or more verify voltages may be provided after each program pulse. In some embodiments, there may be two or more verify pulses between the program pulses. In some cases, one or more initial program pulses are not followed by verify pulses because it is not expected that any storage elements have reached the lowest program state (e.g., A state). Subsequently, program iterations may use verify pulses for the A state, followed by program iterations which use verify pulses for the A and B states, followed by program iterations which use verify pulses for the B and C states, for instance.

Figure 8:
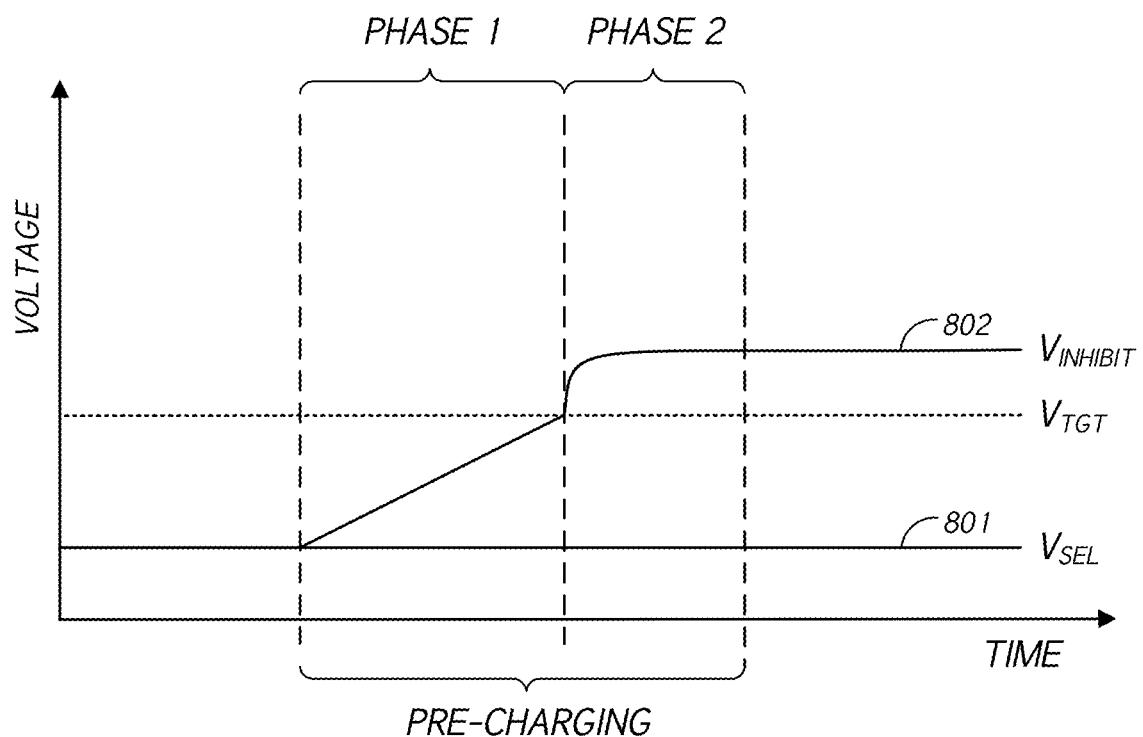
FIG. 8 is a graph illustrating pre-charging voltage applied to a control line in accordance with one or more embodiments.

FIG. 8 is a graph illustrating pre-charging voltage applied to a control line, such as a bit line, in accordance with one or more embodiments. The terms "control line pre-charging," "control line pre-charging stage," and "pre-charging" are used herein according to their broad and ordinary meanings, and may refer in certain contexts to a process for driving a voltage/charge level of a control line (e.g., bit line) to a target voltage level (e.g., inhibit voltage level, desired programming bias, or $V_{DD}$). Control line pre-charging may serve to inhibit programming for associated storage element(s), or promote faster read/write operations, depending on the application. The graph of FIG. 8 shows voltage levels for two types of control lines: (1) a "selected" control line 801, which may generally refer to a bit line that is selected for programming or memory cells on this bit line are currently being programmed; and (2) an "unselected," or "inhibited," control line (e.g., bit line), which may generally refer to a bit line one which memory cells are not currently being programmed, or is currently, or intended to be, pre-charged to an inhibit voltage or other target voltage level. The control line 801, as shown, may be maintained at a ground reference voltage level $V_{SEL}$ throughout the pre-charging time period, whereas the unselected control line 802 may start at the ground reference voltage $V_{SEL}$, and rise to a higher voltage level during the pre-charging time period, such as an inhibit voltage $V_{INHIBIT}$, also called $V_{DDSA}$. The "inhibit voltage level" may correspond to a voltage level that is sufficiently high to counteract the effect of programming voltage pulses applied to storage elements associated with a respective control line (e.g. a word line).

As shown in FIG. 8, the pre-charging process for a control line, such as a bit line, may involve multiple phases. For example, a first phase ("Phase 1") may be associated with constant-current control line charging. Constant-current control line charging limits or controls the current draw through the line during pre-charging. By limiting or controlling the current draw through the control line initially during pre-charging, the current spikes occurring during the initial phase of pre-charging can be reduced. However, because the current draw is limited, the amount of time required for the control line to be charge to the desired bias level may be greater than if charging is unlimited or uncontrolled. During the first phase, a regulated or controlled current may be used to charge the control line 802. During Phase 1, by managing constant-current charging, high current consumption is mitigated.

During Phase 1, the control line 802 may be charged to a target voltage level $V_{TGT}$. The charging of the control line 802 to the target voltage level $V_{TGT}$ may take place over a period of time that spans the duration Phase 1. The term "period of time" is used herein according to its broad and ordinary meaning, and may refer to any temporal duration or period associated with one or more phases of a pre-charging process. The charge pump circuitry associated with the graph of FIG. 8 may be configured to limit the charging current during Phase 1 and/or make the charging current constant, such that the first phase may be considered a constant-current pre-charging phase. In Phase 1, for example, the current on the control line 802 may be limited to approximately 40 mA, which may help control or prevent relatively high current spiking during the first phase of pre-charging. By controlling the ramp-up rate of the control line 802 during Phase 1, the peak current consumption may be decreased or controlled at the expense of requiring additional time to reach the voltage target level $V_{TGT}$.

Once the control line has reached the target voltage level $V_{TGT}$, a second phase ("Phase 2") of the pre-charging process illustrated in FIG. 8 may involve charging the control line 802 without controlling or regulating the current provided to the control line. That is, while in Phase 1, a controlled or regulated current level may be ensured, in Phase 2, no such regulation or control may be implemented on the current from the voltage source (e.g., the inhibit) to the control line.

During Phase 2, the current provided to the control line 802 may be considered a free current, in that the current is not limited, or regulated or controlled any manner. Therefore, the current on the control line 802 may be as high as possible based on the voltage differential between the voltage source and the control line and the impedance associated with the charge path. During Phase 2, relatively high peak current consumption may be experienced due at least in part to control-line-to-control-line (e.g., bit-line-to-bit-line) capacitive coupling.

Some implementations of the present disclosure provide for reduction in peak current consumption during Phase 1 and/or Phase 2 of the pre-charging process. The degree to which the peak current consumption is reduced or controlled may be determined and/or managed by controlling a delay between the beginning of Phase 1 and the beginning of Phase 2. Additionally or alternatively, the degree to which the peak current is reduced may be controlled at least in part by manipulating the voltage target level $V_{TGT}$, such as by increasing the voltage target level $V_{TGT}$ to thereby elongate the period of time associated with Phase 1.

Although the term $V_{INHIBIT}$ is used in FIG. 8 and the associated description, it should be understood that the voltage level to which a control line is charged during pre-charging may be any bias level, such as a read voltage level, or the like. In embodiments in which the control line 802 is a word line, wherein pre-charging of the word line is implemented in connection with a voltage read operation, Phase 1 may involve ramping the word line voltage from approximately 0 V to the reading voltage associated with unselected word lines. For example, the reading voltage may be approximately 6-8 V, which may consume current. Therefore, Phase 1 may serve to provide current control to limit the peak current.

Control Line Bias Variance

FIG. 9 is a diagram that shows an example of different voltages applied to bit lines at different times during a programming operation. Although FIG. 9 is described in the context of bit lines, it should be appreciated that certain concepts disclosed in connection therewith may be applicable to other types of control lines, such as word lines.

Generally, the different charge/voltage levels of neighboring bit lines can impact the capacitive coupling between the neighboring bit lines, which may affect current drawn when charging the bit lines. In certain embodiments, bit lines that are selected for programming have 0V applied thereto, whereas unselected bit lines have a voltage $V_{DD}$ applied thereto, which may correspond to an inhibit voltage level. Note that in some embodiments, some bit lines have an intermediate voltage applied thereto to slow the rate of programming. For convenience, the example and discussion of FIG. 9 does not consider such intermediate voltages.

According to one or more example programming sequences, memory cells to be programmed are initially in the erased state. In connection with execution of a programming operation, memory cells that are targeted for programming to another state (e.g., A, B, C in the example distribution of FIG. 6 described above) may undergo programming with over one or more program loops of the programming operation until the given memory cells reach their intended target threshold voltage. When reaching its target threshold voltage, a memory cell may be locked out from further programming at least in part by charging its associated bit line to an inhibit voltage level (e.g., $V_{DD}$) and maintaining the inhibit voltage while a program voltage is applied to the selected word line. Note that other programming sequences are possible. For example, cells targeted for the B and C states may initially be programmed to an intermediate state. In one embodiment, "foggy-fine" programming is used in which memory cells are first programming to "foggy" states, and subsequently programmed to "fine" states. It should be noted that although certain embodiments are disclosed herein in the context of multi-level cell (MLC) programming comprising four programming states, principles disclosed herein may be applicable to single-level cell (SLC) programming schemes, or MLC programming schemes having more than for programming states.

In certain embodiments, memory cells that are to stay erased are charged to $V_{DD}$ throughout the programming operation. In other words, they are unselected for the duration of the programming operation. Furthermore, some other memory cells may already be above their respective verify levels at or around the beginning of the programming operation. Also, some memory cells may reach their intended states relatively early in programming. Therefore, some of the memory cells may be charged to $V_{DD}$ even relatively early in programming. As programming progresses, more memory cells may reach their intended state, and are therefore charged to $V_{DD}$. The foregoing is represented in FIG. 9 by the three columns of voltages. For at least some embodiments, more and more cells are changed from selected to inhibited from early to later program loops.

As mentioned above, parasitic capacitive coupling may occur between neighboring bit lines (represented by the illustrated capacitors 901 in FIG. 9). When an unselected bit line is charged to $V_{DD}$, but its neighbor is grounded, the coupling or loading between bit lines may be relatively high. Therefore, a relatively large amount of charge (or current) may be required to charge the unselected bit line. Whether an unselected bit line is neighbored on one or both sides by a selected bit line can also impact the amount of charge (or current) needed to charge the unselected bit line. For example, when an unselected bit line is neighbored on one side by a selected bit line, then a coupling capacitance between the two bit lines will be charged. Furthermore, when an unselected bit line is neighbored on both sides by a selected bit then, then two coupling capacitances will be charged. On the other hand, when an unselected bit line is positioned between two other unselected bit lines, this may be viewed as not having to charge a coupling capacitance between the bit lines.

In the example of FIG. 9, during a first period of time $T_1$, which may be associated with one or more of the first programming loops of a programming operation, relatively few of the bit lines may be set to the inhibit voltage level, and therefore the parasitic capacitance between the bit lines may be relatively low. That is, relatively early in programming, bit-line-to-bit-line charge state variance may be relatively low. For example, as in the illustrated example, approximately ⅛ of cells/bit lines may be inhibited at the beginning of a programming operation. At time $T_1$, in the illustrated example, bit line N+3 has a different charge state (and therefore relatively high coupling capacitance) than the bit line N+2 on a first side and N+4 on another side opposite the first side. Bit line N+12 likewise has relatively high coupling capacitance between bit lines on both sides due to the different charge states of its neighboring bit lines. FIG. 9 illustrates that, at the beginning of programming, the line-to-line charge/bias variance, also described herein as "bias level variance," "bias variance," or "charge state variance," may be relatively low.

At a later point in programming, identified in FIG. 9 as time $T_2$, more of the bit lines may have reached an inhibit voltage/charge state $V_{DD}$. The time $T_2$ may be at or around the midway point of the programming operation. At time $T_2$, more of the bit lines have a different charge state than their neighboring bit lines on either or both sides. Therefore, because the line-to-line charge state variance, or bias variance, is higher, it may be expected that more charge (or current) will be needed to charge the unselected bit lines due to the line-to-line coupling capacitances. At or near the end of the programming operation, as represented by the time $T_3$, even more of the bit lines may have reached an inhibit voltage/charge state $V_{DD}$. Therefore, similarly to the beginning of the programming operation, at time $T_3$, more of the bit lines have a similar charge state compared to their neighboring bit lines on either or both sides. That is, at time $T_3$, most of the bit lies will have been charged to the inhibit charge/voltage state, and the line-to-line charge state variance, or bias variance, is therefore relatively lower than at time $T_2$. In view of the greater charge state variance at the midway point in programming, it may be desirable to suppress peak current during such periods of time to a greater degree than may be desired at the beginning or end of programming.

In some implementations, parameters associated with pre-charging of one or more control lines (e.g., bit lines) may be based at least in part on a neighbor-to-neighbor bias variance associated with the control lines. The term "neighbor-to-neighbor bias variance," as referenced above, is used herein according to its broad and/ordinary meaning. In one embodiment, neighbor-to-neighbor bias variance refers to variance of bias on adjacent control lines, such as bit lines. As described in detail herein, control lines may be biased at a first bias level associated with a ground reference voltage level (e.g., 0 V), or alternatively may be biased at a second voltage level that is used to lock-out, or inhibit, the control line. Where neighboring, or adjacent, control lines (e.g., bit lines) have different bias levels, parasitic capacitive coupling may be present between the control lines, which may result in higher electrical reactance in the control line and/or leakage current that causes undesirably-high current spikes. Control line bias variance, as described herein, may indicate a degree to which parallel control lines collectively have a different bias level than their neighboring control lines on one or both sides. That is, control line bias variance may indicate, or be related to, a collective capacitive coupling between control lines of an array of control lines. In some contexts, control line bias variance indicates or describes a likelihood that the bias level of a given control line varies from the bias level(s) of adjacent/neighboring control line(s) on one or both sides. The bias variance among a set of parallel control lines can be random or of a predetermined order. The random nature of the bias variance can be influenced by the data pattern being written to memory cells connected to the control lines, by the manner in which programming is done, as well as other factors.

Neighbor-to-neighbor bias variance can be influenced by a number of factors involved in the memory cell programming process. In one example, whether or not the data being written to the memory cells is scrambled or not can impact the neighbor-to-neighbor bias variance. In another example, how control lines are biased to control the rate at which memory cells are programmed from an original $V_T$ to a target $V_T$ can impact the neighbor-to-neighbor bias variance. In addition, how data values are encoded to be represented by $V_T$ levels of memory cells can impact neighbor-to-neighbor bias variance. Further, how an incremental stepped pulse programming (ISPP) method is implemented can impact neighbor-to-neighbor bias variance.

In one embodiment, data values to be stored in the memory cells are scrambled and the data values are encoded to representative $V_T$ states using a gray code encoding. In addition, the programming process may comprise an ISPP programming process in which memory cells that reach their target $V_T$ are locked-out (inhibited from being programmed) in subsequent ISPP programming loops. In such an embodiment, the neighbor-to-neighbor bias variance is predictable because of the encoding method and the programming method used and can be used to manage a constant-current pre-charging phase. Variance, or variance state, may represent the variance in charge levels, or applied biases, between adjacent bit lines in an array of bit lines. For example, with respect to the variance state of a plurality of bit lines, variance of the bit lines may be representative of bit-line-to-bit-line bias levels, and/or variance of bias levels from neighbor-to-neighbor across a plurality of adjacent parallel bit lines. Variance and variance states/values may represent, or be indicative of, a percentage of control lines that have a different bias level than one or more neighboring control lines, or the probability that a given control line has a different bias level than one or more neighboring control lines. Differences in bias level between neighboring control lines can result in the presence of coupling capacitances between the neighboring control lines, which can cause undesirable current spiking, as described in detail herein.

The neighbor-to-neighbor bias level variance for control lines (e.g., bit lines) may be at least partially reflected or indicated by a bit-to-bit relationship of control line latches that drive the biasing of the respective control lines. "Bit-to-bit" relationship may be used herein to refer to the variance of values stored by sequential bits of a plurality of control line latches (e.g., bit line latches). Although certain embodiments are described herein in the context of bit-line-to-bit-line bias level variation or variance, it should be understood that such principles and concepts may be relevant to other types of control lines, such as word-line-to-word-line bias level variance or variation.

In some contexts, bias variance and/or charge state variation across a plurality of bit lines may indicate bit-line-to-bit-line charge variance with respect to how many of the bit lines have been charge to the inhibit charge level, and/or the relative disposition or positioning of such inhibited bit lines. With respect to a plurality of control lines (e.g., bit lines), bias variance, variance values, line-to-line charge variation or variance, or the like, may indicate or reflect an aggregate line-to-line capacitive coupling associated with the plurality of control lines, which may have an effect on peak current consumption for reasons discussed above. For example, variance in accordance with the present disclosure may indicate or reflect neighbor-to-neighbor charge variance across a plurality of control lines. That is, where a first control line has a charge state that is substantially different than a neighboring control line, relatively substantial capacitive coupling may be present between such control lines. Such capacitive coupling may be indicated or reflected at least in part in the variance state or value associated with such control lines in accordance with the present disclosure. A value or parameter related to, or indicative of, the variance of a plurality of control lines may be referred to herein as a variance value or index in some contexts, or a data variance index. In some implementations, variance is associated with user data to be programmed in the solid-state memory.

The charge states of control lines may be reflected at least in part in values stored in control line latches (e.g., sense amplifier latches). For example, the bit line latches may be used to indicate selected and unselected bit lines, wherein values stored by individual latches may indicate whether respective bit lines are unselected. The term "selected," as used herein, may refer to a bit line or other control line that is biased to a programming voltage, whereas "unselected" may refer to a bit line or other control line that is biased to an inhibit voltage. Generally, unselected bit lines may have a charge state equal to the inhibit voltage. Therefore, as a memory cell being programmed reaches its desired programming state, the bit line associated therewith may become unselected, such that further programming loops do not further program the memory cell. References herein to variance, variance states, bias variance or variation, variance values, bit-line-to-bit-line, control-line-to-control-line or neighbor-to-neighbor charge variance or variation, or the like, may therefore indicate the degree to which neighboring control lines are similarly selected or unselected. That is, a bias variance state or index may represent a measure of how many bit lines are pre-charged differently from their neighbor bit line(s). In some embodiments, a higher variance value or index value may indicate the greater line-to-line capacitive coupling, and there for a higher expected peak current.

Bias variance states, values, and/or indices may be determined or calculated in any suitable or desirable manner, or using any suitable or desirable mechanism. For example, in some embodiments, a variance index or value for a plurality of control lines may be determined by determining a percentage of the control lines that has a first charge level or value, and/or determining a percentage, or number, of the control lines that has a second charge level or value. For example, the charge level or value of interest may be associated with an inhibit voltage level. That is, the percentage or number of the control lines that are unselected or have a charge level that is approximately equal to the inhibit voltage may be used, and the percentage or number not having such charge level may likewise be relied upon to some degree of. For example, the bias variance value or index for a plurality of control lines may be reflected at least in part by the following equation:

$$RV = 2 * P_{\cdot 1} * P_{\cdot 0}, \quad (1)$$

Wherein 'RV' represents the variance value, $P_{\cdot 1}$, represents the percentage or number of the control lines or control line latches that have a first value or charge level (e.g., corresponding to a bit value of '1'), and $P_{\cdot 0}$, represents the percentage or number of the control lines or control line latches that have a second value or charge level (e.g., corresponding to a bit value of '0'). The value 'RV' may be used to determine one or more parameters associated with a control line pre-charging stage of a programming loop or operation.

Variance values/indices may be understood with respect to the following example, which is provided for illustration purposes and may be understood with reference to FIG. 9, as described above. In one example, at or near the beginning of a programming operation, ⅛ of a plurality of memory cells and/or bit lines associated therewith may have a state represented for convenience by the value '1,' wherein '1' indicates that the cell has reached its programmed state and/or the associated bit line is being inhibited, whereas ⅞ of the cells may be at a state represented by the value '0,' wherein '0' indicates that the cell has not reached its programmed state and/or the associated bit line is not being inhibited. At this point in the program operation, the variance value or index may be, for example, 20%/0.2, or some other value indicating that the majority of the cells are at the '0' state. Once approximately half of the cells have been programmed, such as at or around a midway point of the programming operation, approximately 50% of the cells may have a state '1,' whereas the other 50% of the cells may have a state '0.' At this point in the program operation, the variance value or index may be, for example, 50%/0.5, or another value indicating the percentage(s) of cells that are in the various states. At or near the end of the program operation, few or zero cells or bit lines may be associated with the '1' state, whereas all or almost all the cells may be associated with the '0' state. At such point, the variance value or index for the cells or bit lines may be, for example, 0%/0.0, or another value indicating that the majority or all of the cells are at the '0' state.

According to certain solid-state programming schemes, as described above in connection with FIGS. 6 and 7, memory cells are progressively programmed from an erase state to a final desired state (e.g., states A, B, C, etc.). The charge state of a memory cell being progressively programmed may be increased progressively over a plurality of programming loops until the final desired charge state is reached. Once the final programming charge state for a memory cell has been reached, the bit line associated with the memory cell may be locked-out by applying an inhibit voltage/bias level thereto. Generally, for a plurality of parallel bit lines associated with respective memory cells programmed in connection with a programming operation, the progressive locking-out/inhibiting of the bit lines over the course of the programming loops of the programming operation may be considered predictable when programming data is scrambled (also referred to as randomized). Therefore, a table or other data structure may be predefined that maps programming loops, or loop numbers, to bit line bias level variance values. As a programming operation iterates through a plurality of programming loops, the bias variance values or indices may be dynamically adjusted to reflect the current loop in the programming operation. For example, as shown in FIG. 9 and described above, different points in a programming operation (e.g., $T_1$, $T_2$, $T_3$) may generally be associated with different degrees of bit line bias variance (e.g., greater variance for $T_2$ than for $T_1$ or $T_3$). Therefore, it can be assumed that programming loops are associated with increasing variance levels progressing from the beginning of a programming operation to about a midway point in the programming operation, and decreasing variance levels from about the midway point to the end of the programming operation A variance value or index relating to an assumed variance state of a given programming loop may be predefined for each or some of the loops of a programming operation. Such values may be maintained in, for example, a lookup table or other data structure, wherein loop numbers are associated with variance values or index values. The programming loop number may indicate a respective variance value. Table A, provided below, provides an example variance table that may be utilized in some embodiments.

TABLE A

| LOOP NUMBER | VARIANCE VALUE |
|---|---|
| 1 | 20%/0.20 |
| 2 | 27%/0.27 |
| 3 | 33%/0.33 |
| . . . | . . . |

TABLE A-continued

| LOOP NUMBER | VARIANCE VALUE |
| --- | --- |
| 12 | 50%/0.50 |
| ... | ... |
| 22 | 8%/0.08 |
| 23 | 0%/0.00 |

Although Table A includes percentages in the variance value fields, it should be understood that data variance values and indexes may be represented in any suitable or desirable way, and using any numeric or other value, including decimal values or the like. The use of predefined variance values, as described above, may advantageously require little or no dynamic calculation relative to certain other embodiments. The use of predefined variance values may be implemented in contexts in which complete data randomness with respect to data to be programmed is assumed. Where programming data is substantially random, use of predefined variance values may provide an accurate prediction of the actual variance of memory cells and/or control lines at each respective loop of the programming operation. That is, predefined variance values may be particularly useful or applicable where the randomness of the data being programmed is relatively predictable and/or stable.

In some implementations, variance values and/or indices associated with memory cells and/or control lines associated therewith may be determined through calculation of actual neighbor-to-neighbor charge state variation. That is, the variance may provide an actual measure of the degree of difference of charge/bias levels of control lines from their respective neighbors. Such implementations may be particularly advantageous where the programming data is not perfectly random, or cannot be assumed to be perfectly random. For example, in certain special case data programming contexts, such as programming of system data or other device data that may not be random, direct calculation of actual variance of cells and/or associated control lines may advantageously provide desirable accuracy with respect to variance determinations.

In some embodiments, actual variance may be calculated by accessing or otherwise determining line-to-line charge level data, wherein the charge level of each individual control line is represented by a binary value, such as the bit value of '1' or '0.' That is, the charge levels of a plurality of control lines may be represented by data comprising a string of binary values, wherein the binary values indicate whether the respective control line (e.g., bit line) is selected/unselected, or whether the respective control line is set to an inhibit charge level. In certain embodiments, the charge levels of the plurality of control lines may be determined with reference to, or represented by, values stored in control line latches (e.g., bit line latches) associated with the programming of the relevant cells. Certain logical operations may be performed on such data to determine the degree to which individual cells/control lines differ according to charge level from their neighbors on one or both sides. The following example illustrates a specific implementation of variance value calculation in accordance with one or more embodiments of the present disclosure. Although certain logical operations, numbers of bits, and/or order of operations are shown in the example below, it should be understood that the principles related to such example may be applicable in implementations involving any number of bits, cells, control lines, logical operations, and/or values or calculated values. Direct calculation of variance in accordance with embodiments of the present disclosure may advantageously provide desirable accuracy in variance determinations.

According to an example implementation, variance may be calculated with respect to a data string ('$D_0$') having the following values: $D_0=1001011100101$, wherein each bit/value in the string represents the charge state of a single control line or cell. The calculation may involve shifting the data string one position to the left, to produce a shifted string '$D_{-1}$'$=0010111001010$. The calculation may further involve shifting the data string one position to the right, to produce a shifted string '$D_{+1}$'$=0100101110010$.

The calculation may further involve performing an exclusive OR operation on $D_0$ and $D_{-1}$ to produce ($D_0 \text{XOR} D_{-1}$)$=1011100101111$, and performing an exclusive OR operation on $D_0$ and $D_{+1}$ to produce ($D_0 \text{XOR} D_{+1}$)$=1101110010111$. The calculation may further involve calculating the following percentages for $D_0 \text{XOR} D_{-1}$ and $D_0 \text{XOR} D_{+1}$: $P_{\cdot 1} \cdot (D_0 \text{XOR} D_{-1})$, representing the percentage of '1' values in $D_0 \text{XOR} D_{-1}$; $P_{\cdot 0} \cdot (D_0 \text{XOR} D_{-1})$, representing the percentage of '0' values in $D_0 \text{XOR} D_{-1}$; $P_{\cdot 1} \cdot (D_0 \text{XOR} D_{+1})$, representing the percentage of '1' values in $D_0 \text{XOR} D_{+1}$; and $P_{\cdot 0} \cdot (D_0 \text{XOR} D_{+1})$, representing the percentage of '0' values in $D_0 \text{XOR} D_{+1}$.

For the example presented, the values for the percentages recited above may be as follows: $P_{\cdot 1} \cdot (D_0 \text{XOR} D_{-1})=9/13 \approx 70\%/0.7$; $P_{\cdot 0} \cdot (D_0 \text{XOR} D_{-1})=4/13 \approx 30\%/0.3$; $P_{\cdot 1} \cdot (D_0 \text{XOR} D_{+1})=9/13 \approx 70\%/0.7$; and $P_{\cdot 0} \cdot (D_0 \text{XOR} D_{+1})=4/13 \approx 30\%/0.31$.

The calculation may further involve determining an average value $P_{\cdot 1}$, for the percentage of '1' values: $P_{\cdot 1}=(P_{\cdot 1} \cdot (D_0 \text{XOR} D_{-1})+P_{\cdot 1} \cdot (D_0 \text{XOR} D_{+1}))/2 \approx 70\%/0.7$; and determining an average value $P_{\cdot 0}$, for the percentage of '0' values: $P_{\cdot 0}=(P_{\cdot 0} \cdot (D_0 \text{XOR} D_{-1})+P_{\cdot 0} \cdot (D_0 \text{XOR} D_{+1}))/2 \approx 30\%/0.3$.

Based on the foregoing, the variance value/index ('RV') may be calculated using the following equation:

$$RV=2*P_{\cdot 1}*P_{\cdot 0} \approx 42\%/0.42 \qquad (2)$$

Peak Current Suppression

Figure 10A:
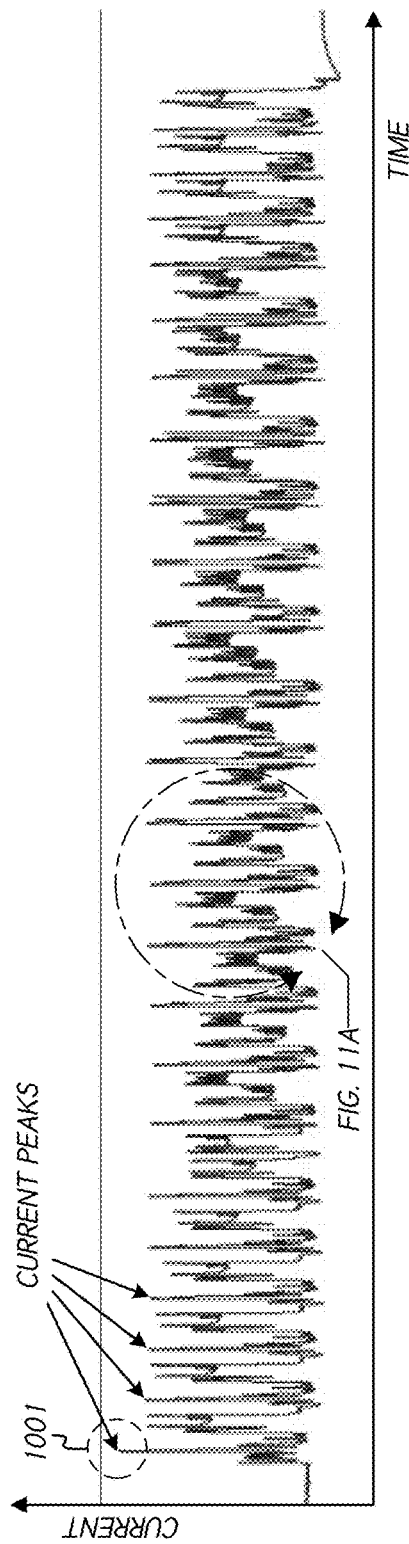
FIG. 10A is a graph illustrating a current profile for a programming operation in accordance with one or more embodiments.

FIG. 10A is a graph illustrating an exemplary current profile over a plurality of programming loops for a solid-state memory programming operation in accordance with one or more embodiments. For example, the profile shown in FIG. 10A may correspond to a programming operation in a 3-D NAND memory chip comprising, for example, up to 96 layers or more, and configured to implement multi-level cell (MLC), triple-level cell (TLC), and/or quad-level cell (QLC) programming architectures.

Figure 11A:
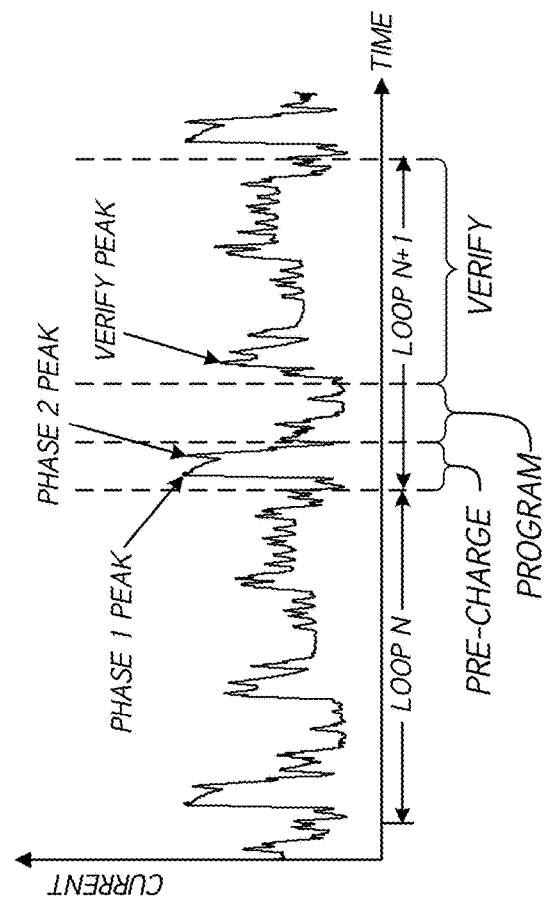
FIG. 11A illustrates a segment of the graph of FIG. 10A including a subset of the programming loops of the programming operation shown in FIG. 10A in accordance with one or more embodiments.

FIG. 11A illustrates a segment of the graph of FIG. 10A, wherein the segment of FIG. 11A includes a subset of the programming loops of the relevant programming operation. The graphs of FIGS. 10 and 11 illustrate three distinct stages, or periods, including a pre-charging stage, a programming pulse stage, and a verify stage, each of which are identified in FIG. 11A. In some implementations, during the programming pulse stage, a relatively high voltage (e.g., 20 V) may be applied to program the memory cells. During first and second phases of the pre-charging stage, and during the verify stage, certain current peaks may occur, as illustrated. Generally, the peaks that have the greatest impact on peak current consumption for the memory array and/or device may occur during the pre-charging stage, while lesser peaks may occur during the verify stage. By reducing or controlling the current peaks in the pre-charging and/or verify stages, peak current consumption for the data storage device may be managed or suppressed.

For a given programming operation, as shown for the programming operation illustrated in the graph of FIG. 10A, the pre-charging stage of the first programming loop of the programming operation may be associated with a peak current 1001 that represents a highest peak current of the programming operation. As described in detail above, the pre-charging stage of a programming loop comprise a first phase ("Phase 1") associated with a timing clock during which a constant current is used to charge-up control lines (e.g., bit lines) to a target voltage level, which may be a percentage or portion of the inhibit voltage level (e.g., 80% of the inhibit voltage level the inhibit). Generally, the peak current 1001 occurring during the first programming pulse/loop of the program operation may be higher than other current peaks/spikes of the programming operation. For example, in some embodiments, the first phase (i.e., controlled-current phase) of the pre-charging stage of the first programming pulse may include a peak current that is approximately 47 mA, whereas the subsequent loops of the programming operation may include peak current spikes that are of the order of approximately 40 mA. That is, in certain embodiments, the peak current in the first programming loop may be approximately 18% higher, or more, than the second largest peak current spike. The first phase of the pre-charging state may be considered a "constant-current phase," in that the current supplied to the relevant control line may maintain a constant value over at least a portion of the first phase. Furthermore, the first phase of the pre-charging state may be referred to as a "managed-current phase," or a "regulated-current phase," in the sense that the current may be managed or regulated by certain control circuitry to achieve a desired level. "managed current," "managed charging current," "regulated current," and "regulated charging current" are used herein respectively according to their broad and ordinary meanings, and generally refer to current flow that is managed or regulated in some manner. During the second phase of the pre-charging process, unlimited current may be allowed to relatively rapidly charge up the desired control line(s) (e.g., bit line(s)). Such phase may be referred to herein as the "unregulated" or "unmanaged" current phase. The terms "unregulated charging current," "unregulated current," "unmanaged charging current," and "unmanaged current" are used herein according to their broad and ordinary meanings, and generally refer to charging current, such as for charging a control line, that is not substantially managed or regulated.

The occurrence of the higher peak current 1001 in the first programming loop may be due at least in part to the state of the entire memory circuit at the time of the first programming loop, wherein the memory cells may initially charge-up in connection with the first programming pulse/loop. At that time, parasitic capacitances between control lines may be charged-up, causing extensive peak current consumption. That is, during the first loop of a programming operation, the control circuitry of the solid-state storage device may be burdened with not only charging up certain control lines tied to the memory cells, but also the parasitic capacitances between control lines, which may result in current leakage to charge the parasitic capacitances. Therefore, the total current flowing through the solid-state memory device or chip may be higher for the first loop. For subsequent loops, the relevant parasitic capacitances may already be at least partially charged, and therefore additional currents may not be drawn to charge the parasitic capacitances until after the circuit is again discharged. In some embodiments, the peak current associated with the first loop of the programming operation may be approximately 8 mA higher than corresponding peak current spikes in subsequent loops of the programming operation. Therefore, the peak current associated with the first phase of the pre-charging stage of the first loop of the programming operation may present a current bottleneck for the peak current stack.

Peak current management may be necessary or desirable in order to ensure that the solid-state memory device meets necessary or desirable current specifications, which may be related to the average current consumption during program and/or read operations. Therefore, excessively high current spikes may increase the average current consumption across data points over a programming operation. Furthermore, absolute peak current, as defined by the highest current level consumed during a program or read operation, may likewise represents an important or critical specification or characteristic of the solid-state memory device, wherein excessively high peak current levels may limit the number of solid-state memory dies that may be run in parallel due to the power supply burden imposed by the current spike(s).

Figure 12:
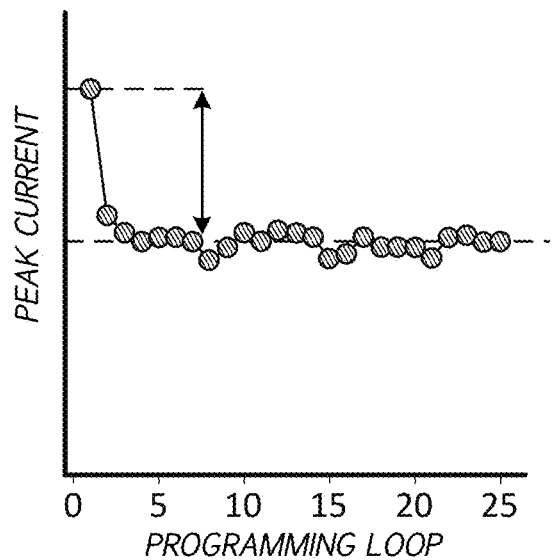
FIG. 12 is a graph showing peak current in a first phase of a pre-charging stage over loops of a programming operation in accordance with one or more embodiments.

FIG. 12 is a graph showing example data points for a plurality of programming loops of a programming operation, wherein the peak current occurring during each program loop is charted. The graph of FIG. 12 specifically shows peak current values occurring during a controlled-current phase of a pre-charging stage of the programming operation. As shown, the peak current associated with the first loop of the programming operation as being clearly higher than the subsequent programming loops. This illustrated peak current for each programming loop may generally be the peak current associated with the first phase (i.e., controlled-current phase) of the pre-charging stage, and therefore the highest peak current is attributable to the first phase of the pre-charging stage of the first loop of the programming operation.

In view of the current profiles illustrated in FIGS. 10, 11, and 12, it may be desirable to reduce the peak current during the constant-/controlled-current phase of the first loop of a given program operation. In some implementations, the present disclosure provides for peak current reduction in the first phase (i.e., controlled-current phase) of the pre-charging stage of the first loop of a programming operation. For example, in some embodiments, the controlled current applied to the bit lines during such phase may be reduced from approximately 40 mA to 30 mA, or some other value that is less than 40 mA. For embodiments in which the constant/controlled current level applied throughout a programming operation is some value other than 40 mA, the peak current compensation may involve using a controlled current value during the first loop of the programming operation that is some value less than the default controlled current value applied for subsequent loops of the programming operation. Where the constant current level is reduced for the first loop of the program operation, it may be necessary for the constant current phase of the pre-charging stage of the first loop to be elongated and/or delayed by some amount order to allow for the charge level of the bit lines to rise to the desired voltage target level. For example, in some embodiments, the controlled-current phase of the pre-charging stage of the first programming loop may be approximately 1 µs, or some other delay period, longer than that of subsequent programming loops. Alternatively, the controlled-current phase of the pre-charging stage of the first loop may be maintained as having the same length as subsequent loops, wherein the peak current occurring during the uncontrolled current phase of the pre-charging stage of the first programming loop may be relatively higher as a result than in subsequent steps due to the use of a lower current level during the controlled-current phase.

Subsequent to the first phase of the pre-charging stage of programming loops, as described above, a second phase of the pre-charging stage may likewise be accompanied by one or more current spikes/peaks. As described in detail above, the second phase of the pre-charging stage may be associated with a free- or uncontrolled-current charging of unselected bit lines, wherein the current peak of the second phase may ride on the falling edge of the first peak associated with the first phase of the pre-charging stage. During the second phase of the pre-charging stage, the maximum possible current is allowed to charge up the bit lines as fast as possible to the final inhibit voltage target level in order to increase the speed/performance of the pre-charging stage.

As illustrated in the current profile of FIG. 10A, in some implementations, the peak current occurring during the second phase (i.e., free current phase) of the pre-charging stage may generally not be consistent throughout the whole programming cycle, and rather may rise and fall over the course of the programming operation. For example, while the first phase of the pre-charging stage may involve the application of a constant/controlled current, in the second phase, the current is applied to the bit lines may not be substantially controlled, and may therefore be at least partially adaptive to, or dependent on, the bit-line-to-bit-line coupling capacitances. Therefore, the variance, or charge variation, of the neighboring bit lines may affect the free-current phase peak current levels.

Figure 10B:
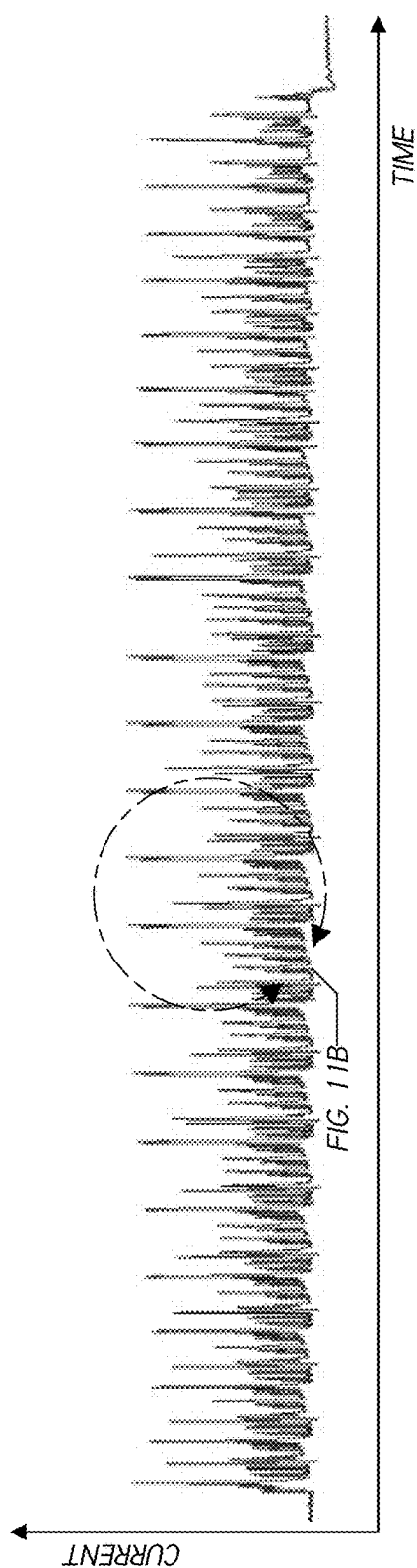
FIG. 10B is a graph illustrating a current profile for a programming operation in accordance with one or more embodiments.
Figure 11B:
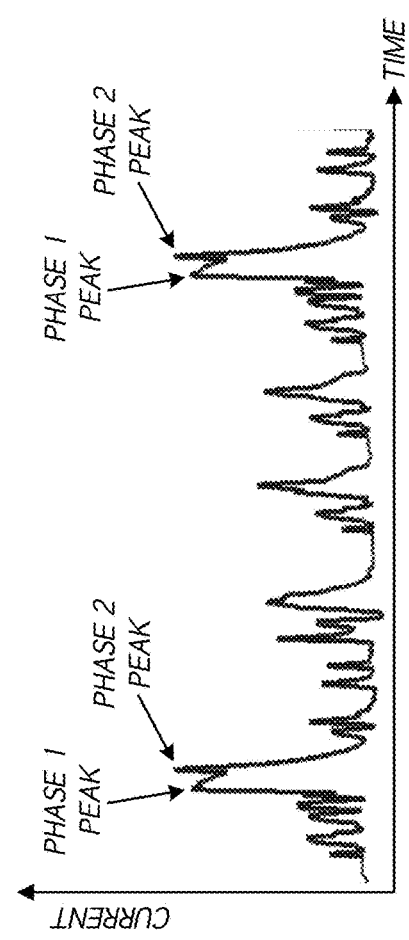
FIG. 11B illustrates a segment of the graph of FIG. 10B including a subset of the programming loops of the programming operation shown in FIG. 10B in accordance with one or more embodiments.

FIG. 10B is a graph illustrating another example current profile over a plurality of programming loops for a solid-state memory programming operation in accordance with one or more embodiments. FIG. 11B illustrates a segment of the graph of FIG. 10B, wherein the segment of FIG. 11B includes a subset of the programming loops of the relevant programming operation. FIGS. 10B and 11B show that the current peak associated with the second phase (Phase 2; free/uncontrolled current phase) of a pre-charging stage may be relatively high and/or greater than the current peak associated with the first phase (Phase 1; controlled current phase) of the pre-charging stage during one or more loops of the programming operation. The extent of the Phase 2 current peak may be at least partially loop dependent, and may be relatively greater during the middle loops of the programming operation than at the beginning or end, as illustrated in FIG. 13, described below.

Figure 13:
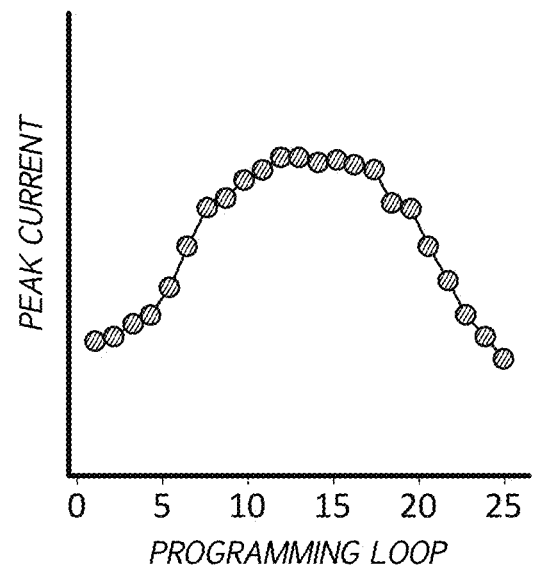
FIG. 13 is a graph showing peak current in a second phase of a pre-charging stage over loops of a programming operation in accordance with one or more embodiments.

FIG. 13 illustrates example data points for a plurality of programming loops a programming operation, wherein peak current values are charted for the uncontrolled-current phase of the pre-charging stages of the programming loops of the programming operation. As shown in FIG. 13, in some embodiments, the peak current occurring in the second phase (i.e., free- or uncontrolled-current phase) of the pre-charging stage may present a bell-shaped curve over the programming loops of the program operation. That is, the peak current occurring in the second phase of the pre-charging stage may be highest around the midpoint of the programming operation and lower at the beginning and end points.

As referenced above, the peak current occurring in the uncontrolled-current phase of the pre-charging stage may be at least partially correlated with the variance associated with the charge states, or bias levels, of the memory cells and/or bit lines across the memory device or subsegment thereof. For example, with respect to three-bit-per-cell programming schemes, which allow for memory cells to be charged to one of eight logical states, at the beginning of a programming operation (e.g., loop one of the programming operation), approximately ⅛ of the memory cells may be charged to an inhibit voltage level $V_{INHIBIT}$, whereas the remaining approximately ⅞ of the cells may be subject to programming, wherein the associated bit line charge level is approximately 0 V, for example. At such point in the programming operation, bias variance across the control lines may be relatively low due to the majority of the cells being associated with a similar bit line bias/charge level, and therefore the peak current experienced during the second phase of the pre-charging stage may be relatively low.

As programming advances, more and more bit lines may reach an inhibit voltage charge level, and therefore variance across the bit lines may become larger, thereby increasing peak current in the second phase of the pre-charging stage. At about the midway point of the programming operation, about half of the cells being programmed may have finished programming, and therefore their associated bit lines may be charged to the inhibit voltage level, whereas the remaining half of the cells may continue to be programmed. Therefore, around the midpoint of the programming operation, variance of the bias/charge states of the bit lines may be relatively large, resulting in relatively higher peak current in the second phase of the pre-charging stage.

As programming advances past the midway point, less and less of the bit lines remain in a grounded state to allow for programming of respective associated memory cells, and therefore data variance decreases, resulting in decreasing peak current values in the second phase of the pre-charging stage. When the programming operation reaches the last programming loop, almost all cells will have finished programming, and therefore almost all bit lines will be charged to the inhibit voltage level, resulting in relatively low variance across the bit lines, and therefore relatively low peak current in the second phase of the pre-charging stage.

In order to compensate for the peak current profile shown in FIG. 13, certain embodiments disclosed herein provide for decreasing the peak current in the uncontrolled-current phase of the pre-charging stage of programming loops to a degree that is dependent at least in part on the variance associated with bias/charge levels of bit lines (or word lines) of a data storage device, as implemented by control circuitry of the data storage device. For example, such peak current suppression may be performed at least in part by control circuitry of the memory die 312 of FIG. 3, described above. Such control circuitry may comprise one or more processors, data storage devices, electrical connections, and/or the like. In some implementations, no peak current suppression for the uncontrolled-current phase of the pre-charging stage is implemented for the first and/or last loops of the programming operation, as such loops may be impacted to the least degree by peak current spikes in the uncontrolled-current phase, as shown in FIG. 13.

In some embodiments, peak current suppression is achieved at least in part by extending or prolonging the first phase (i.e., controlled-current phase) of the pre-charging stage, such as by manipulation or dynamic modification of one or more parameters associated therewith. For example, in some implementations, the target bit line voltage associated with the first phase, or controlled-current phase, of the pre-charging stage may be increased, such that the amount of time required to reach such target voltage may be greater than with respect to the default target voltage. Additionally or alternatively, the first phase of the pre-charging stage may be prolonged or extended by controlling or extending a timer associated with the first phase of the pre-charging stage to thereby delay completion of the first phase of the pre-charging stage.

Figure 14:
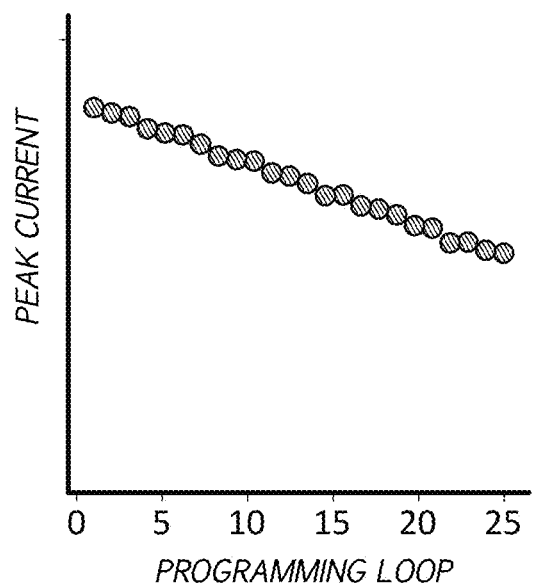
FIG. 14 is a graph showing peak current in a verify phase of a pre-charging stage over loops of a programming operation in accordance with one or more embodiments.

With further reference to FIG. 11A, the verify stage may involve the pre-charging of unselected word lines as well as selected word lines. Generally, selected word lines may correspond to those memory cells that are desired to be read during the verify stage. The selected word lines may be charged to ramp-up from approximately 0 V to approximately 3 V in some embodiments, whereas the unselected word lines may be charged to ramp-up from approximately 0 V to approximately 7 V. The charging of the selected and/or unselected word lines during the verify stage may result in one or more current spikes or peaks. As illustrated in FIG. 14, which illustrates peak current data points during the verify stage over a plurality of programming loops of a programming operation, the peak current in the verify stage may generally decline over the course of the programming operation. That is, the highest peak current values for the verify stage may occur in the earliest programming loops, whereas the lowest peak current values may occur in connection with the final programming loops. Therefore, in order to reduce the effect of current spikes during the verify stage, some embodiments disclosed herein provide for the suppressing of current in pre-charging word lines to a higher degree in earlier programming loops than in subsequent programming loops. Such peak current suppression may be achieved through prolonged controlled-current word line charging, and/or increased controlled-current target voltage levels, as described in detail herein.

The degree to which the controlled-current phase of the pre-charging stage is extended or prolonged to compensate for current spikes in the verify period may depend at least in part on a current loop number of the programming operation. For example, as described above, at the beginning of the programming operation, the vast majority of memory cells may have a relatively low charge level, such that current flowing through the solid-state memory chain is relatively high. Conversely, at the end of the programming cycle, the vast majority of cells may have a relatively high charge state, such that the current consumed a relatively low. Therefore, for the first loop(s), the delay or extension of the first phase of the pre-charging stage may be relatively high, and may be incrementally decreased throughout the loops of the programming operation. Therefore, peak current suppression in the verify period of the programming operation may be implemented using predefined parameters for the various loops of the programming operation. Although FIG. 14 is described herein with respect to the verify phase of a programming operation, it should be understood that the description herein relating to word line pre-charging, and suppression of peak current associated therewith, may be implemented with respect to a read operation. For example, during a read operation, word lines and/or bit lines may be ramped-up up to a target value and read. Such ramp-up phase may consume a relatively large amount of power, resulting in peak current spikes during the read operation. Therefore, for read operations, peak current suppression techniques as described herein may be implemented with respect to selected or unselected word line pre-charging, or with respect to the bit line pre-charging associated with the read operation. In each of these cases, the uncontrolled current pre-charging time may be controlled to suppress or limit the peak current occurring during such periods.

Figure 15:
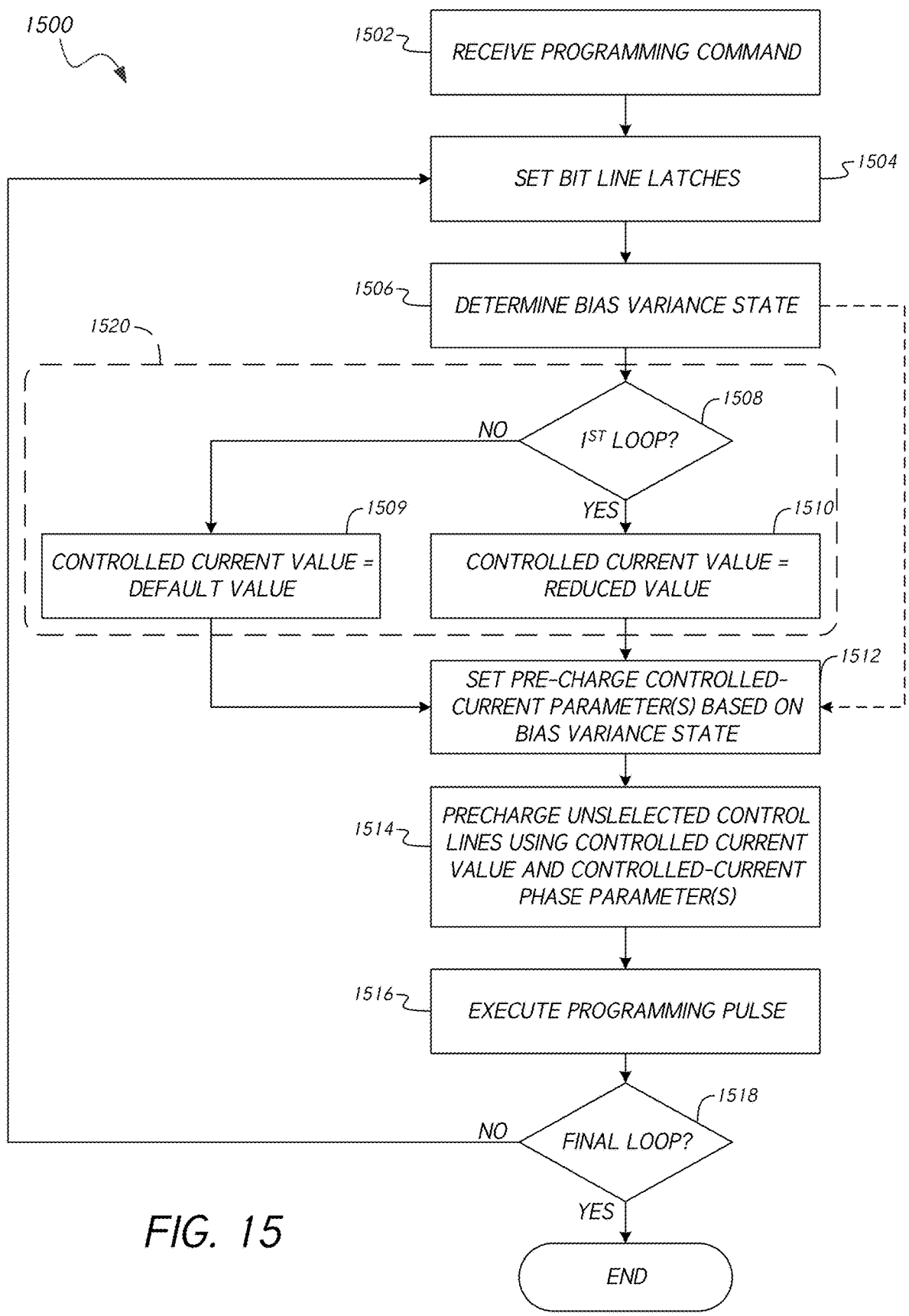
FIG. 15 is a flow diagram illustrating a process for dynamically controlling peak current in a solid-state memory device in accordance with one or more embodiments.

FIG. 15 is a flow diagram illustrating a process 1500 for dynamically controlling peak current in a solid-state memory device. The process 1500 may be performed at least in part using control circuitry of a data storage device. By at least partially suppressing peak current during one or more of loops of a programming operation, the process 1500 may provide performance improvements, and/or improved power efficiency. Although the description below of FIG. 15 is described in the context of bit lines and bit line pre-charging associated with a programming command, it should be understood that the peak current suppression concepts and techniques disclosed in connection with FIG. 15 may be applicable to word line peak current suppression, and/or peak current suppression associated with read commands.

At block 1502, the process 1500 involves receiving a programming command. For example, the programming command may be received from a host communicatively coupled to control circuitry of a data storage device. The data storage device may be, for example, a solid-state memory device comprising one or more solid-state memory arrays including transistor-based memory cells. Memory cells of the solid-state memory may be associated with respective control lines, including bit lines and/or word lines.

At block 1504, the process 1500 involves setting bit line latches corresponding to a plurality of bit lines associated with the solid-state memory cells, wherein the bit line latches may be used to set a voltage condition on the respective connected bit lines. For example, a predetermined state latched in a bit line latch may result in the associated bit line being pulled to a state designating program inhibit. Therefore, at block 1504, the bit line latches may be set to designate selected and/or unselected bit lines, wherein selected bit lines are subject to programming in a subsequent programming loop, whereas unselected bit lines are charged to an inhibit voltage level to prevent memory cells associated with such bit lines from being programmed in a subsequent programming loop.

At block 1506, the process 1500 involves determining a bias variance state associated with the bit lines and/or bit line latches. For example, as described in detail herein, the bias variance state determined at block 1506 may be representative or indicative of bit-line-to-bit-line charge state variation across the bit lines. Although the process 1500 illustrates a discrete step of determining the bias variance state at block 1506, it should be understood that, in some embodiments, the bias variance state is not actively or directly determined. That is, in some embodiments, the process 1500 may at least in part omit the action of block 1506 illustrated in FIG. 15.

The blocks 1508, 1509, and 1510 represent a sub-process 1520 for peak current suppression for suppressing current spikes that may occur in the first phase, or controlled-current phase, of a pre-charging stage of the first loop of a programming operation, as described in detail herein. In some embodiments, the process 1500 omits one or more of the steps of the sub process 1520. That is, the process 1500 may or may not involve the first loop peak current suppression for the first phase of the pre-charging stage.

At decision block 1508, it is determined whether the current loop being performed of the programming operation is the first loop of the programming operation. If so, the process 1500 may involve setting a controlled current value associated with the first phase, or controlled-current phase, of the pre-charging stage to a reduced value that is less than a default controlled-current value. For example, the reduced value may be approximately 10 mA less than the default value. Where the current loop is not the first loop, the process 1500 may proceed to block 1509, where the controlled current value may be set to, or allowed to remain at, a default value. In some embodiments, the default value may be approximately 40 mA.

At block 1512, the process 1500 involves setting pre-charge parameters to values that are based on, or depend at least in part on, the bias variance state. For example, the controlled-current phase parameters may be based on a value indicative of the bias variance state. That is, determining the bias variance state at block 1506 may involve determining one or more values indicative of the variance of the bias/charge states of the bit lines and/or bit line latches, wherein the pre-charge controlled-current phase parameters are based at least in part on such value(s). In some embodiments, the pre-charge controlled-current phase parameters may comprise a timing delay parameter, which may directly control the period of time (i.e., the length of time) during which the control line(s) are charged using the controlled current. In some embodiments, the pre-charge controlled-current phase parameters may comprise a target voltage parameter, which indicates a target voltage to which the control line(s) are charged during the first phase of the pre-charging stage using the controlled current. Where the target voltage parameter is set to a higher level, the length of time of the controlled-current phase of the pre-charging stage may necessarily be lengthened to allow the voltage level to ramp-up to the higher target voltage.

Although FIG. 15 illustrates a discrete step of setting the pre-charge controlled-current phase parameters at block 1512, in some embodiments, the pre-charge controlled-current phase parameters are not actively or directly set, but rather the pre-charge controlled-current phase parameters may be based on the bias variance state, wherein no discrete action of setting the parameters is performed.

At block 1514, the process 1500 involves pre-charging unselected (and/or selected) control lines (e.g., bit lines) using the controlled-current value and the pre-charge controlled-current phase parameter(s). For example, pre-charging may be performed on the relevant control lines during a first phase for a period of time that is determined by, or based at least in part on, the bias variance state. For example, the relevant pre-charge controlled-current phase parameters may involve one or more of timing delay parameter(s) and/or target voltage parameter(s), each of which may affect or determine the length of time of the first phase of the pre-charging stage.

At block 1516, the process 1500 involves executing the programming pulse, which may be performed after completion of pre-charging of the unselected control/bit lines. At decision block 1518, if the present programming loop is the final loop of the programming operation, the process 1500 may end. However, if additional loops of the programming operation remain to be performed, the process 1500 may return to block 1504, or 1506, and the process 1500 may continue until the programming operation is complete.

Figure 16:
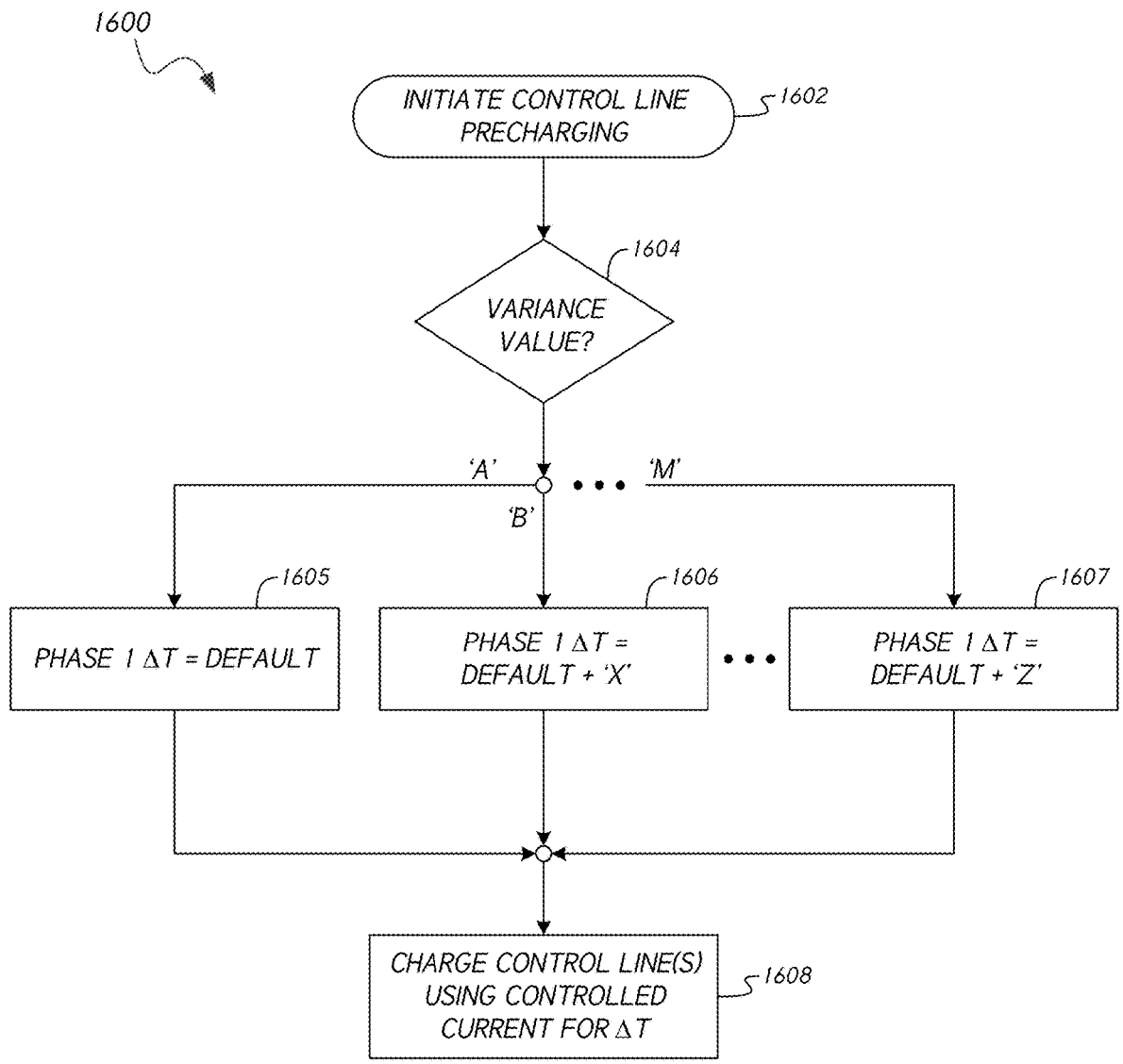
FIG. 16 is a flow diagram illustrating a process for managing peak current in a solid-state data storage device in accordance with one or more embodiments.

FIG. 16 illustrates a process 1600 for managing peak current in a solid-state data storage device. At block 1602, the process 1600 involves initiating a control line pre-charging process for a plurality of control lines (e.g., bit lines) associated with a solid-state memory array. In connection with the control line pre-charge process, at block 1604, a variance value associated with the plurality of control lines may be assessed.

The process 1600 may proceed to set a length of time parameter associated with a first phase of the pre-charging process based on the assessed variance value. The first phase may be a controlled-current phase, as described in detail herein. In assessing the variance value and setting the length of time parameter, for example, if the variance value is a first value represented as 'A' in the diagram of FIG. 16, the length of time parameter $\Delta T$ may be a default length of time, whereas another variance value represented for convenience as 'B' may be associated with a length of time parameter $\Delta T$ that is greater than the default length of time. For example, the variance value 'B' may be greater than the variance value 'A,' or vice versa. Additional variance values may be associated with additional length of time parameters, as represented by the block 1607 associated with the variance value 'M.' The length of time parameter $\Delta T$ may be set to a default time, extended by a delay value that is based on the variance value.

At block 1608, the process 1600 involves charging the control lines using a controlled current for the length of time identified in blocks 1605-1607.

Figure 17:
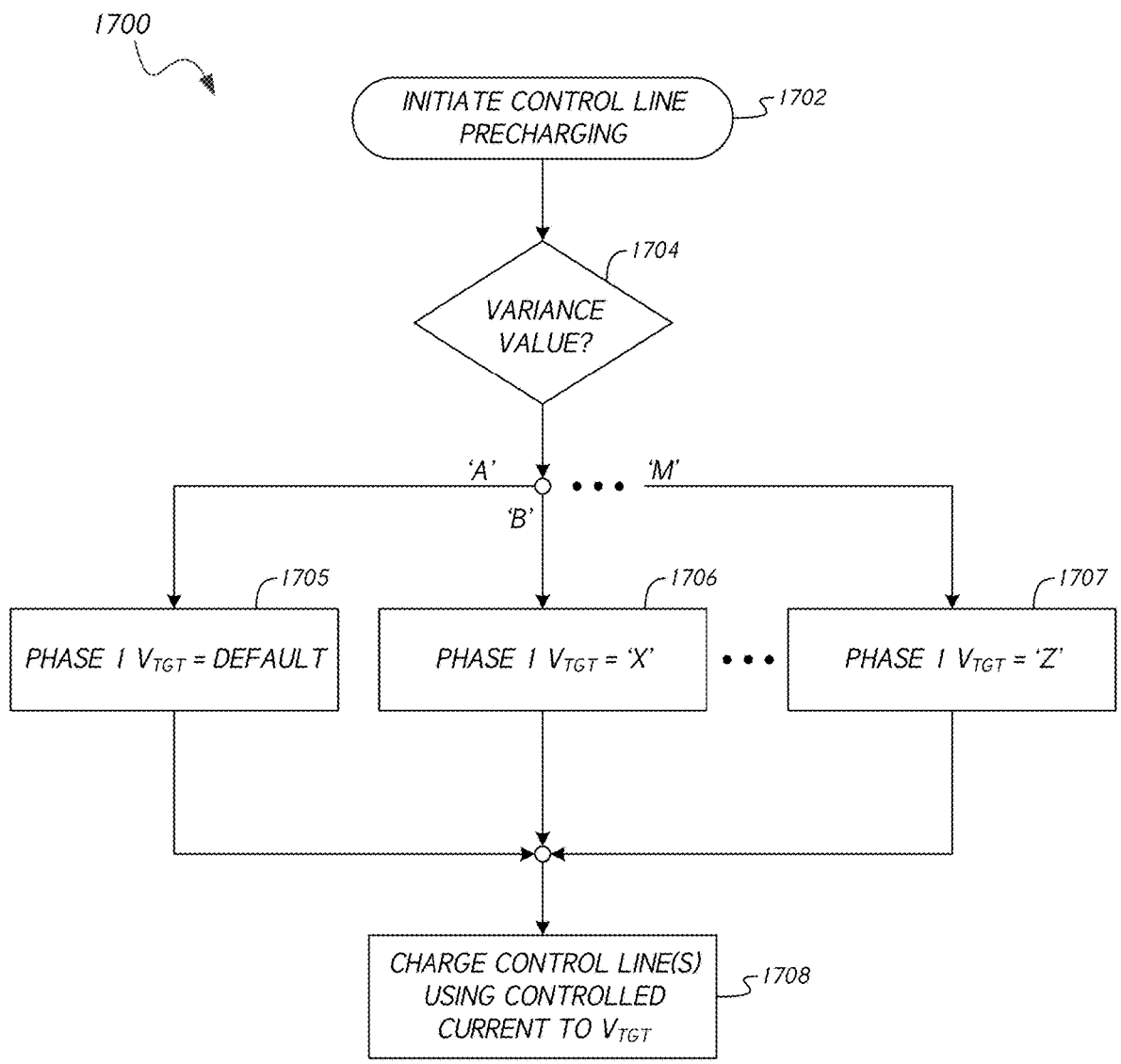
FIG. 17 is a flow diagram illustrating a process for managing peak current in a solid-state data storage device in accordance with one or more embodiments.

FIG. 17 illustrates a process 1700 for managing peak current in a solid-state data storage device. At block 1702, the process 1700 involves initiating a control line pre-charging process for a plurality of control lines (e.g., bit lines) associated with a solid-state memory array. In connection with the control line pre-charge process, at block 1704, a variance value associated with the plurality of control lines may be assessed.

The process 1700 may proceed to set a target voltage parameter associated with a first phase of the pre-charging process based on the assessed variance value. The first phase may be a controlled-current phase, as described in detail herein. In assessing the variance value and setting the target voltage parameter, for example, if the variance value is a first value represented as 'A' in the diagram of FIG. 17, the target voltage parameter $V_{TGT}$ may be a default level, whereas another variance value represented for convenience as 'B' may be associated with a target voltage parameter $V_{TGT}$ that is greater than the default target voltage. For example, the variance value 'B' may be greater than the variance value 'A,' or vice versa. Additional variance values may be associated with additional target voltage parameters, as represented by the block 1707 associated with the variance value 'M.' The target voltage parameter $V_{TGT}$ may be set to a percentage of an inhibit voltage level.

At block 1708, the process 1700 involves charging the control lines using a controlled current to the target voltage level identified in blocks 1705-1707.

Figure 18:
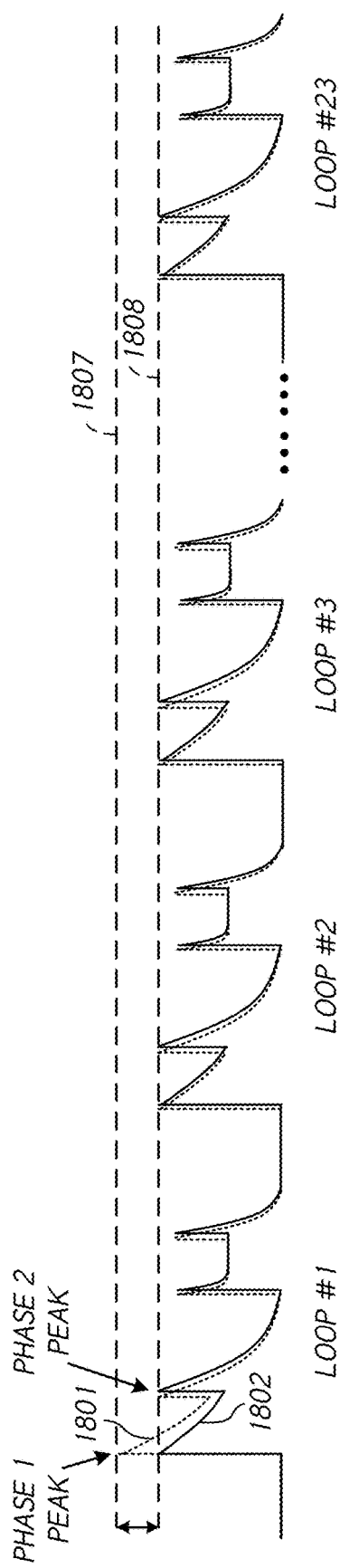
FIG. 18 illustrates a current profile for a programming operation in which the peak current associated with a controlled-current phase of the pre-charging stage has been adaptively reduced for a first loop of a programming operation in accordance with one or more embodiments.

FIG. 18 illustrates a current profile for a programming operation in which the peak current associated with a controlled-current phase of the pre-charging stage has been adaptively reduced for a first loop of a programming operation in accordance with one or more embodiments of the present disclosure. For comparison, the diagram of FIG. 18 shows a first current profile 1801 in which adaptive peak current reduction is not implemented, as compared to a second current profile 1802 in which peak current reduction is implemented for the first loop of the programming operation. As described above, peak current for a programming operation may generally occur in connection with the first programming pulse, and in particular a first phase (i.e., controlled-current phase) of the pre-charging stage of the first programming pulse. As shown, the Phase 1 peak for the first loop is higher than subsequent peaks for subsequent programming loops. By adaptively reducing constant current control for only the first programming loop, peak current can be reduced by as much as 20% or more with negligible performance penalty (e.g. approximately 0.04% or less) in some implementations.

Figure 19:
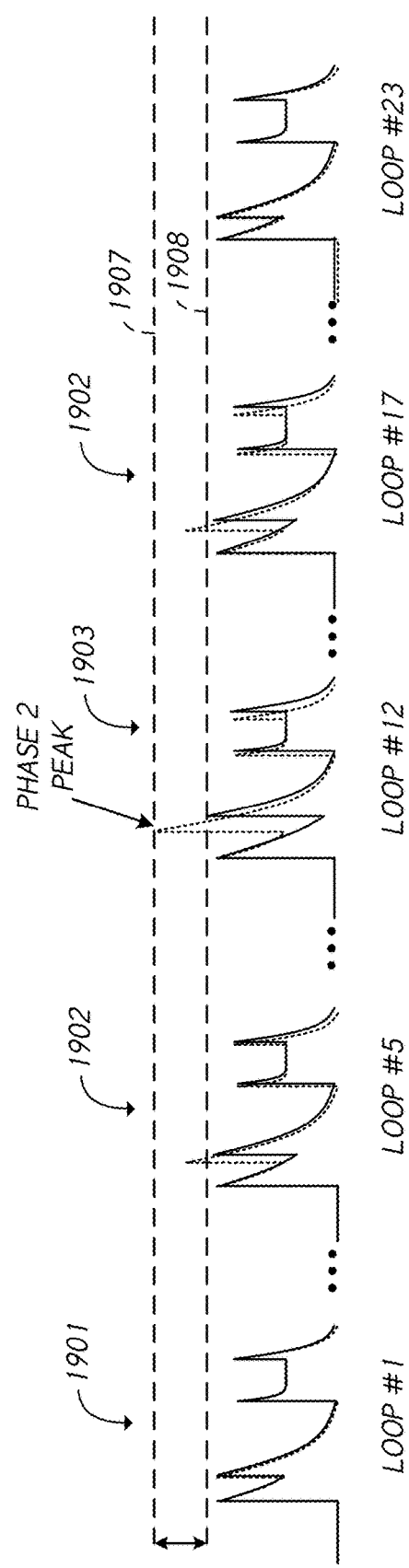
FIG. 19 illustrates current profile for programming operation, in which the peak current associated with a non-controlled-current phase of a pre-charging stage has been adaptively reduced for one or more loops of the programming operation in accordance with one or more embodiments.

FIG. 19 illustrates current profile for a programming operation in which the peak current associated with a non-controlled-current phase of a pre-charging stage has been adaptively reduced for one or more loops of the programming operation. Such reduction may be greater for those loops that are associated with relatively higher variance, as described and defined herein. For example, one or more loops at or about a midway point of the programming operation, such as loop number 12 (1903) of a 23- or 24-loop programming operation may advantageously be implemented with modified pre-charging parameters in order to suppress the peak current that may occur without peak current suppression. Such current suppression may advantageously reduce the peak current for the loop(s) from the peak current 1907 to a lower peak current 1908. The loop(s) at or about the midway point of the programming operation may be suppressed to a greater degree than other loops of the programming operation. In some embodiments, one or more additional loops (e.g., 1902) may also be suppressed with respect to peak current through the use of modified pre-charging parameters, wherein such loops 1902 are suppressed to a lesser degree than the loop 1903. In some embodiments one or more loops at or about the beginning and/or end points of the programming operation may be only minimally suppressed with respect to pre-charging current, or not suppressed at all.

During programming, the variance value associated with the bias/charge states of the bit lines and/or the values stored in the bit line latches may dynamically change to reflect updated charges and/or bit line latch statuses. The associated peak current may proportionally increase with increases in variance. Peak current suppression in connection with FIG. 19 may involve any suitable or desirable current suppression method. For example, in one embodiment, the time period or delay associated with the first phase (i.e., controlled-current phase) of the pre-charging stage may be elongated to allow for the charging current to further drop before being boosted-up in connection with the second phase (i.e., free-, or uncontrolled-current phase) of the pre-charging stage. Additionally or alternatively, the current may be suppressed at least in part by increasing the voltage target level associated with the first phase of the pre-charging stage, thereby allowing the current level to further drop before being boosted-up at the advent of the second phase of the pre-charging stage. As shown in FIG. 19, solutions disclosed herein may advantageously allow peak current in the second phase of the pre-charging stage to reduce adaptively to the program data pattern over the course of a programming operation. When the variance associated with the control lines and/or associated latches is high (e.g., relatively high bit-line-to-bit-line coupling that leads to higher peak current), peak current may be substantially reduced.

ADDITIONAL EMBODIMENTS

Those skilled in the art will appreciate that in some embodiments, other types of data storage systems and/or current suppression schemes can be implemented. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

Methods and processes described herein may be embodied in, and partially or fully automated via, software code modules executed by one or more general and/or special purpose computers. The word "module" may refer to logic embodied in hardware and/or firmware, or to a collection of software instructions, possibly having entry and exit points, written in a programming language, such as, for example, C or C++. A software module may be compiled and linked into an executable program, installed in a dynamically linked library, or may be written in an interpreted programming language such as, for example, BASIC, Perl, or Python. It will be appreciated that software modules may be callable from other modules or from themselves, and/or may be invoked in response to detected events or interrupts. Software instructions may be embedded in firmware, such as an erasable programmable read-only memory (EPROM). "Module" may further refer to one or more devices, components, systems, or subsystems, which may conceptually implement relevant functionality. It will be further appreciated that hardware modules may be comprised of connected logic units, such as gates and flip-flops, and/or may be comprised of programmable units, such as programmable gate arrays, application specific integrated circuits, and/or processors. The modules described herein are preferably implemented as software modules, but may be represented in hardware and/or firmware. Moreover, although in some embodiments a module may be separately compiled, in other embodiments a module may represent a subset of instructions of a separately compiled program, and may not have an interface available to other logical program units.

What is claimed is:

1. An apparatus comprising:
   a plurality of solid-state storage elements;
   a plurality of control lines coupled to the plurality of solid-state storage elements; and
   control circuitry in communication with the plurality of control lines and configured to:
      during a first phase of a control line pre-charging stage, charge one or more unselected control lines of the plurality of control lines using a regulated charging current for a period of time based at least in part on a bias variance state associated with the plurality of control lines; and
      during a second phase of the control line pre-charging stage, charge the one or more unselected control lines to an inhibit voltage level using an unregulated charging current.

2. The apparatus of claim 1, wherein the control circuitry is further configured to, during the first phase, charge the one or more unselected control lines to a target voltage level associated with the first phase using the regulated charging current, wherein the target voltage level is based at least in part on the bias variance state.

3. The apparatus of claim 1, wherein:
the control circuitry is further configured to determine the bias variance state at least in part by calculating a variance value associated with the plurality of control lines; and
the variance value is based at least in part on a percentage of the plurality of control lines that are charged to the inhibit voltage level.

4. The apparatus of claim 3, wherein the control circuitry is further configured to calculate the variance value at least in part by multiplying the percentage of the plurality of control lines that are charged to the inhibit voltage level by a percentage of the plurality of control lines that are not charged to the inhibit voltage level.

5. The apparatus of claim 3, wherein:
the control circuitry is further configured to calculate the variance value at least in part by:
determining a first percentage of the plurality of control lines that have a charge state that is different than a neighboring control line on a first side; and
determining a second percentage of the plurality of control lines that have a charge state that is different than a neighboring control line on a second side opposite the first side; and
the variance value is based at least in part on a sum of the first percentage and the second percentage.

6. The apparatus of claim 1, wherein the bias variance state is based at least in part on a loop number of a programming operation.

7. The apparatus of claim 1, wherein the unselected control lines are unselected bit lines.

8. The apparatus of claim 1, wherein:
the period of time comprises a default period of time and a delay period of time; and
the delay period of time is based on the number of control lines that are charged to the inhibit voltage level.

9. A method of operating a solid-state data storage device, the method comprising:
during a first phase of a bit line pre-charging stage, charging one or more unselected bit lines of a plurality of bit lines in the solid-state data storage device using a regulated charging current for a period of time based at least in part on a bias variance state associated with the plurality of bit lines, the plurality of bit lines coupled to solid-state storage elements; and
during a second phase of the bit line pre-charging stage, charging the one or more unselected bit lines to an inhibit voltage level using an unregulated charging current.

10. The method of claim 9, further comprising:
during the first phase, charging the one or more unselected bit lines to a target voltage level associated with the first phase using the regulated charging current, wherein the target voltage level is based at least in part on the bias variance state.

11. The method of claim 9, further comprising:
determining the bias variance state based on a percentage of the plurality of bit lines that are unselected.

12. The method of claim 9, further comprising:
determining the bias variance state at least in part by multiplying a percentage of the plurality of bit lines that are selected by a percentage of the plurality of bit lines that are unselected.

13. The method of claim 9, further comprising:
determining a first percentage of the plurality of bit lines that have a charge state that is different than a neighboring bit line on a first side;
determining a second percentage of the plurality of bit lines that have a charge state that is different than a neighboring bit line on a second side opposite the first side; and
determining the bias variance state based on a sum of the first percentage and the second percentage.

14. The method of claim 9, further comprising:
determining the bias variance state based on a loop number of a programming operation.

15. A non-volatile storage device comprising:
a plurality of data storage cells;
a plurality of bit lines each coupled to one or more of the plurality of data storage cells; and
control circuitry in communication with the plurality of bit lines and configured to:
determine a bit-line-to-bit-line charge variation across the plurality of bit lines;
charge unselected bit lines using a controlled current for a first period of time, a length of the first period of time being based at least in part on the bit-line-to-bit-line charge variation; and
after the first period of time, charge the unselected bit lines using a free current for a second period of time.

16. The non-volatile storage device of claim 15, wherein the control circuitry is further configured to charge the unselected bit lines using the controlled current at least in part by charging the unselected bit lines to a first target voltage, wherein the first target voltage is based at least in part on the bit-line-to-bit-line charge variation.

17. The non-volatile storage device of claim 16, wherein:
the control circuitry is further configured to charge the unselected bit lines using the free current at least in part by charging the unselected bit lines to a second target voltage;
the second target voltage is greater than the first target voltage;
the first target voltage is a percentage of the second target voltage; and
the percentage is based on the determined the bit-line-to-bit-line charge variation.

18. The non-volatile storage device of claim 15, wherein the control circuitry is further configured to calculate the bit-line-to-bit-line charge variation at least in part by multiplying a percentage of the plurality of bit lines that are selected by a percentage of the plurality of bit lines that are unselected.

19. The non-volatile storage device of claim 15, wherein the control circuitry is further configured to calculate the bit-line-to-bit-line charge variation at least in part by:
determining a first percentage of the plurality of bit lines that have a charge state that is different than a neighboring bit line on a first side; and
determining a second percentage of the plurality of bit lines that have a charge state that is different than a neighboring bit line on a second side opposite the first side; and
the bit-line-to-bit-line charge variation is based at least in part on a sum of the first percentage and the second percentage.

* * * * *